United States Patent
Tazoe et al.

(10) Patent No.: US 9,368,668 B2
(45) Date of Patent: Jun. 14, 2016

(54) PHOTOELECTRIC CONVERSION DEVICE MANUFACTURING METHOD, PHOTOELECTRIC CONVERSION DEVICE, AND IMAGING SYSTEM

(71) Applicant: CANON KABUSHIKI KAISHA, Tokyo (JP)

(72) Inventors: Koichi Tazoe, Sagamihara (JP); Yu Arishima, Yokohama (JP); Akira Okita, Yamato (JP); Kazuki Ohshitanai, Kawasaki (JP); Yasuharu Ota, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/316,369

(22) Filed: Jun. 26, 2014

(65) Prior Publication Data

US 2015/0001377 A1 Jan. 1, 2015

(30) Foreign Application Priority Data

Jun. 28, 2013 (JP) ................................. 2013-137049

(51) Int. Cl.
*H01L 27/00* (2006.01)
*H01L 31/18* (2006.01)
*H01L 27/146* (2006.01)

(52) U.S. Cl.
CPC ............ *H01L 31/18* (2013.01); *H01L 27/1461* (2013.01); *H01L 27/14603* (2013.01); *H01L 27/14609* (2013.01); *H01L 27/14612* (2013.01); *H01L 27/14641* (2013.01); *H01L 27/14689* (2013.01)

(58) Field of Classification Search
CPC ............ H01L 21/823481; H01L 31/18; H01L 27/1465; H01L 27/14605
See application file for complete search history.

(56) References Cited

U.S. PATENT DOCUMENTS 9,029,182 B2 * 5/2015 Aoki ....................... H01L 31/18
438/59

FOREIGN PATENT DOCUMENTS

| JP | 2004-349430 A | 12/2004 |
|----|---------------|---------|
| JP | 2006-024907 A | 1/2006 |
| JP | 2006-120711 A | 5/2006 |
| JP | 2006-303385 A | 11/2006 |
| JP | 2007-067379 A | 3/2007 |

(Continued)

*Primary Examiner* — Tony Ko
(74) *Attorney, Agent, or Firm* — Canon USA, Inc., IP Division

(57) ABSTRACT

A method comprises preparing a semiconductor substrate having a first portion, and a second portion including a first region and a second region; forming an active region in the first portion, and an isolating portion of an insulator defining the active region in the second portion; forming a first semiconductor region of a first conductivity type configuring a first photoelectric conversion element, a second semiconductor region of first conductivity type configuring a second photoelectric conversion element, a third semiconductor region of first conductivity type, a fourth semiconductor region of the conductivity type, a first gate electrode configuring a first transfer transistor, and a second gate electrode configuring a second transfer; exposing the first region of the semiconductor substrate, and performing ion implantation masked by a first photoresist pattern covering the second region of the semiconductor substrate, thus forming a fifth semiconductor region of a second conductivity type.

16 Claims, 16 Drawing Sheets

(56) References Cited

FOREIGN PATENT DOCUMENTS

| | | | |
|---|---|---|---|
| JP | 2007-243197 A | 9/2007 |
| JP | 2008-270299 A | 11/2008 |
| JP | 2012-044219 A | 3/2012 |
| JP | 2012-142994 A | 7/2012 |

* cited by examiner

PHOTOELECTRIC CONVERSION DEVICE MANUFACTURING METHOD, PHOTOELECTRIC CONVERSION DEVICE, AND IMAGING SYSTEM

BACKGROUND OF THE INVENTION

1. Field of the Invention

The present invention relates to a photoelectric conversion device manufacturing method, a photoelectric conversion device, and an imaging system.

2. Description of the Related Art

Photoelectric conversion devices, such as charge-coupled devices (CCD) and complementary metal-oxide semiconductor (CMOS) devices are used in many digital still cameras and digital camcorders. Configurations to reduce pixel area are being studied with regard to photoelectric conversion devices.

Japanese Patent Laid-Open No. 2007-243197 discloses sharing pixels to reduce the area of photoelectric conversion elements in accordance with reduction in size. Japanese Patent Laid-Open No. 2007-243197 also discloses differentiating between using insulating isolation regions and junction isolation regions among adjacent photoelectric conversion elements. Specifically, both junction isolation region and insulating isolation region are provided for isolation of photoelectric conversion elements. A transfer gate (gate electrode) is provided by way of an insulating isolation region between photoelectric conversion elements.

While Japanese Patent Laid-Open No. 2007-243197 does discuss differentiating between using insulating isolation regions and junction isolation regions, detailed study is not made regarding the structure and manufacturing method of an isolation region where a transfer gate electrode is provided. Depending on the structure of the isolation region where a transfer gate electrode is provided, deteriorated transfer efficiency, increase leak current, variance in properties of the transfer path, and so forth, may occur.

SUMMARY OF THE INVENTION

A photoelectric conversion device manufacturing method according to the present invention includes: preparing a semiconductor substrate having a first portion, and a second portion including a first region and a second region; forming an active region in the first portion, and an isolating portion formed of an insulator which defines the active region in the second portion; forming, on the semiconductor substrate, a first semiconductor region of a first conductivity type, which is positioned in the active region, and constitutes a first photoelectric conversion element, a second semiconductor region of the first conductivity type, which is positioned in the active region, and constitutes a second photoelectric conversion element, a third semiconductor region of the first conductivity type, which is positioned in the active region, a fourth semiconductor region of the first conductivity type, which is positioned in the active region, a first gate electrode, extending from between the first semiconductor region and the third semiconductor region in the active region to the first region, configuring a first transfer transistor conjointly with the first semiconductor region and the third semiconductor region, and second gate electrode, extending from between the second semiconductor region and the fourth semiconductor region in the active region to the first region, configuring a second transfer transistor conjointly with the second semiconductor region and the fourth semiconductor region; and exposing the first region of the semiconductor substrate, and performing ion implantation with a first photoresist pattern covering the second region of the semiconductor substrate as a mask, so as to form a fifth semiconductor region of a second conductivity type. The fifth semiconductor region is positioned beneath the isolating portion.

A photoelectric conversion device according to the present invention includes: a semiconductor substrate upon which is provided an active region, and an isolating portion formed of an insulator which defines the active region, and includes a first region and a second region; a first semiconductor region of a first conductivity type, which is positioned in the active region, and constitutes a first photoelectric conversion element; a second semiconductor region of the first conductivity type, which is positioned in the active region, and constitutes a second photoelectric conversion element; a third semiconductor region of the first conductivity type, which is positioned in the active region; a fourth semiconductor region of the first conductivity type, which is positioned in the active region; a first gate electrode, positioned between the first semiconductor region and the third semiconductor region in the active region, and in the first region, configuring a first transfer transistor conjointly with the first semiconductor region and the third semiconductor region; and a second gate electrode, positioned between the second semiconductor region and the fourth semiconductor region in the active region, and in the first region, configuring a second transfer transistor conjointly with the second semiconductor region and the fourth semiconductor region. An impurity concentration of the second conductivity type of the semiconductor substrate in the first region is lower than the impurity concentration of the second conductivity type of the semiconductor substrate in the second region.

Further features of the present invention will become apparent from the following description of exemplary embodiments with reference to the attached drawings.

DESCRIPTION OF THE EMBODIMENTS

Figure 6A:
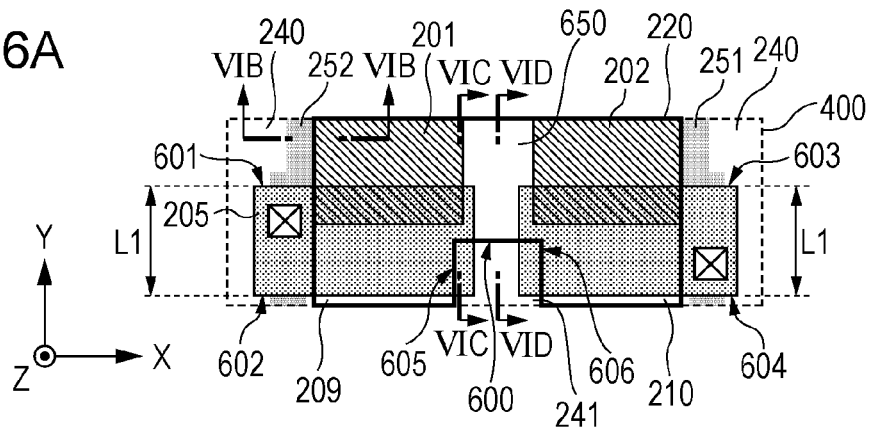
FIG. 6A is a schematic plan view illustrating the photoelectric conversion device according to the first embodiment.

A photoelectric conversion device according to the present embodiment will first be described with reference to FIGS. 6A through 6D. The photoelectric conversion device includes a semiconductor substrate on which are formed one active region 220, and an isolating portion formed of an insulator which defines the active region 220, as illustrated in FIG. 6A. The isolating portion includes a first region, and a second region other than the first region. One active region 220 includes first through fourth semiconductor regions of a first conductive type, a first gate electrode, and a second gate electrode. A first semiconductor region 201 constitutes a first photoelectric conversion device, and a second semiconductor region 202 constitutes a second photoelectric conversion device. A first gate electrode 205 is positioned in the first region, and is positioned between the first semiconductor region 201 and a third semiconductor region 209. A second gate electrode 206 is positioned in the first region, and is positioned between the second semiconductor region 202 and a fourth semiconductor region 210. The first semiconductor region 201, third semiconductor region 209, and first gate electrode 205 constitute a first transfer transistor, and the second semiconductor region 202, fourth semiconductor region 210, and second gate electrode 206 constitute a second transfer transistor. Note that the first region is the region within the isolating portion where the gate electrodes are provided, and other than this is the second region.

Figure 6B:
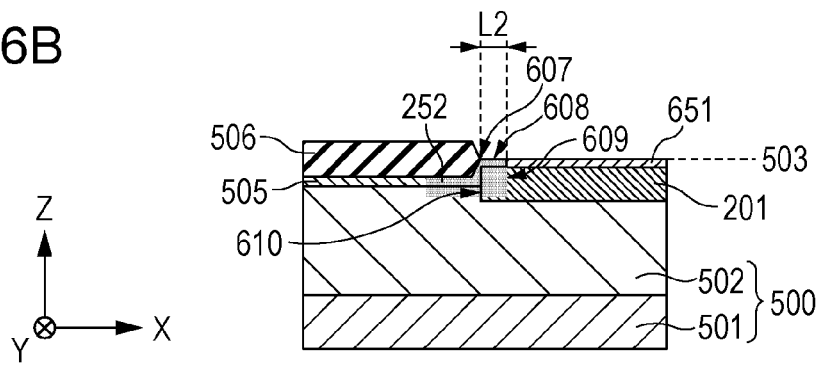
FIGS. 6B through 6D are schematic cross-sectional views illustrating the photoelectric conversion device according to the first embodiment.

A manufacturing method of manufacturing such a photoelectric conversion device includes a step for preparing the semiconductor substrate which the active region 220 and isolating portion have been formed. The fifth semiconductor region 252 is formed beneath the isolating portion 506 as illustrated in FIGS. 6A and 6B. The step of forming the fifth semiconductor region 252 includes a step of exposing the first region of the semiconductor substrate, and performing ion implantation with a first photoresist pattern covering the second region of the semiconductor substrate as a mask.

That is to say, the photoresist pattern formed by an exposure different from another exposure used to form the isolating portion covers the isolating portion where the gate electrodes overlap. In other words, when performing the ion implantation using the photoresist pattern formed by an exposure different from another exposure used to form the isolating portion as a mask, no ion implantation is performed at the portion where the gate electrodes overlap. This manufacturing method enables reduction in the effects of process error in a formation of the photoresist pattern on the transfer paths, thereby reducing variance in transfer path properties. Accordingly, good transfer paths can be provided.

The photoelectric conversion device according to the present embodiment is configured such that the impurity concentration of the second conductivity type in the first region is lower than the impurity concentration of the second conductivity type in the second region. This configuration enables reducing noise to the photoelectric conversion elements and broadening the effective width of transfer paths of transfer transistors, thereby enabling improved transfer efficiency. This configuration also enables diffusion of P-type impurities to the transfer path, and variance in transfer transistor threshold values and transfer transistor transfer path width to be reduced.

First through sixth embodiments will be described in detail with reference to drawings. In the following description, schematic plan views are diagrams where various configurations have been projected as to a plane including the surface of the semiconductor substrate, from a direction perpendicular to the main surface of the semiconductor substrate (plan view). Such schematic plan views are also called plan layout diagrams. Schematic cross-sectional views are diagrams illustrating various configurations of the photoelectric conversion device at a plane perpendicular to a plane including the surface of the semiconductor substrate.

The length direction of the transfer path of the transistor is the direction of a line segment connecting the source and drain. The width direction of the transfer path is a direction perpendicular to the length direction of the transfer path. Note that the following description will be made regarding a case where the signal charge is electrons. In a case where the signal charge is a hole, the N-type (first conductivity type) and P-type (second conductivity type) in the description should be inverted.

First Embodiment

The photoelectric conversion device according to the present embodiment will be described with reference to FIGS. 1 through 11B. The photoelectric conversion device according to the present embodiment is a CMOS type photoelectric conversion device, for example.

Figure 1:
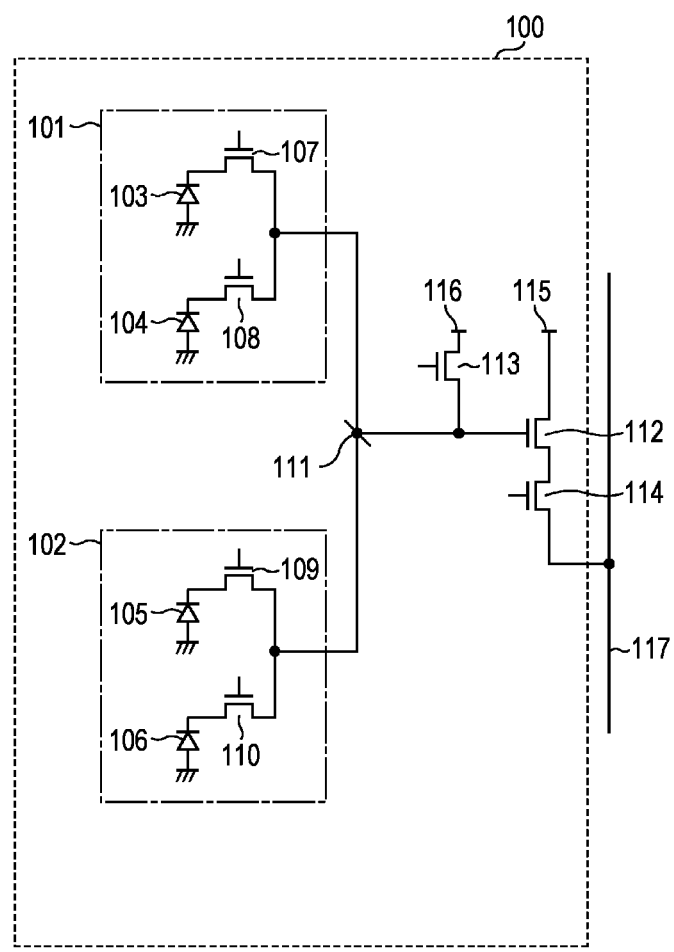
FIG. 1 is an equivalent circuit diagram of a photoelectric conversion device according to a first embodiment.

FIG. 1 is an equivalent circuit diagram of the photoelectric conversion device according to the first embodiment. FIG. 1 illustrates an equivalent circuit of a pixel cell 100. The pixel cell 100 includes two pixels 101 and 102, and a common readout circuit for these. Each pixel according to the present embodiment includes at least two photoelectric conversion elements. Specifically, the pixel 101 includes two photoelectric conversion elements 103 and 104, a transfer transistor 107 corresponding to the photoelectric conversion element 103, and a transfer transistor 108 corresponding to the photoelectric conversion element 104. The pixel 102 includes two photoelectric conversion elements 105 and 106, a transfer transistor 109 corresponding to the photoelectric conversion element 105, and a transfer transistor 110 corresponding to the photoelectric conversion element 106. The transfer transistors 107 through 110 are connected to a floating diffusion (hereinafter "FD") node 111. The FD node 111 is connected to the gate electrode of an amplifying transistor 112 constituting a source follower circuit, and connected to the source of a reset transistor 113. The drain of the amplifying transistor 112 is electrically connected to a power source 115, and the drain of the resent transistor 113 is electrically connected to a power source 116. A selecting transistor 114 is provided on a signal path between the source of the amplifying transistor 112 and a signal line 117, and outputs signals from the amplifying transistor 112 to the signal line 117 at an optional timing. The signal line 117 has multiple pixel cells 100 connected thereto. The photoelectric conversion device according to the present embodiment has multiple signal lines 117. The pixels are arrayed two-dimensionally. Note that description will be made here regarding a case where the transistors are N-type MOS transistors.

In a case of providing one microlens (omitted from illustration) to one pixel in the present embodiment, a signal for detecting focus can be obtained. For example, in a case of obtaining an imaging signal, the signal charges of the photoelectric conversion elements 103 and 104 can be mixed at the FD node 111 and read out as an imaging signal of the pixel 101. In a case of obtaining a signal for detecting focus, a signal based on the signal charge of the photoelectric conversion element 103 can be read out, followed by the signal based on the signal charge of the photoelectric conversion element 104 being read out, and focus detection performed by phase difference detecting. An imaging signal can also be obtained by reading out a signal based on the signal charge of the photoelectric conversion element 103, and then reading out a signal based on the signal charge of the photoelectric conversion element 104, following which these are composited at a separate circuit from the photoelectric conversion device.

The pixel cell 100 is not restricted to the configuration illustrated in FIG. 1. For example, the pixel cell 100 does not have to include the selecting transistor 114.

Next, the photoelectric conversion device according to the present embodiment will be described with reference to FIGS. 2A through 4. FIGS. 2A through 4 are schematic plan view for describing the photoelectric conversion device according to the present embodiment. FIGS. 2A through 4 illustrate a plan layout of nine pixels. The pixel cell 100 is repeatedly disposed in FIGS. 2A through 4. Any one or multiple pixels of the nine pixels in FIGS. 2A through 4 are denoted by reference numerals. Note that portions where contact plugs are disposed are represented by checked squares in FIGS. 2A through 4.

Figure 2A:
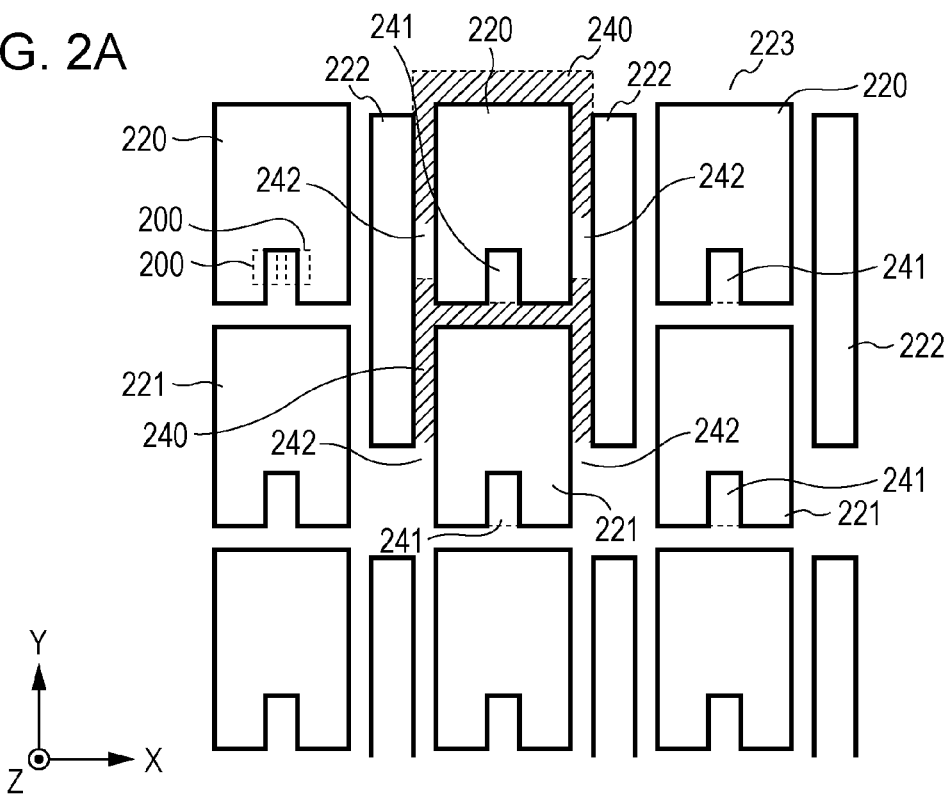
FIGS. 2A and 2B are schematic plan views illustrating a photoelectric conversion device according to the first embodiment.

FIG. 2A is a schematic plan view illustrating active regions 220 through 222 and an inactive region 223. The active regions 220 through 222 are regions where elements such as photoelectric conversion elements and transistors can be formed on the surface of the semiconductor substrate. The inactive region 223 is a region where the isolating portion formed of an insulator is formed on the surface of the semiconductor substrate, and is also referred to as a field region. In plan view, the isolating portion defines the outer edge of the inactive region 223, and also defines the outer edge of the active regions 220 through 222. The inactive region 223 exists around the active regions 220 through 222. In FIG. 2A, the pixel cell 100 includes the active region 220 of the pixel 101, the active region 221 for the pixel 102, and the active region 222 for the two pixels 101 and 102.

Now, we will define a region 240 and a region 241 in the plan layout of the pixel cell 100 for the sake of description. FIG. 2A illustrates the region 240, region 241, and a region 242, in one pixel cell 100, indicated by hatching. The region 241 and region 242 are regions where a later-described gate electrode is provided (first region). The region 240 is all other regions (second region). The region 240 is formed so as to surround the portions where photoelectric conversion elements are formed, and provided between the active region 220 and active region 221, between the active region 220 and active region 222, and between the active region 221 and active region 222. The region 241 is positioned between transfer paths of two transfer transistors which will be described later, and in this case is positioned in the recess of the active region 220 and the recess of the active region 221. Regions 200 illustrated in the adjacent pixel cell 100 are first regions, and are the outer edge of the isolating portion between active regions 220 where the gate electrode is provided.

Figure 2B:
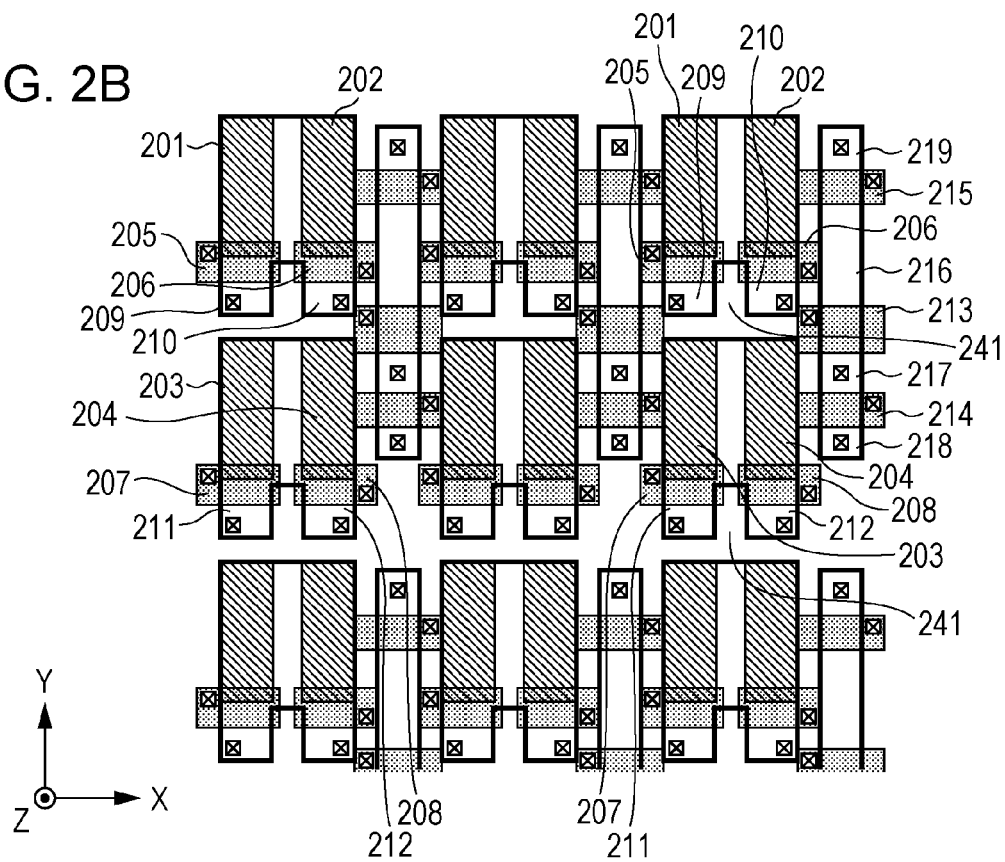

FIG. 2B is a schematic plan view illustrating, in addition to the components illustrated in FIG. 2A, the N-type semiconductor region constituting the photoelectric conversion element, and the gate electrodes constituting the transistors.

Two photoelectric conversion elements are provided in one active region in the photoelectric conversion device according to the present embodiment. An N-type semiconductor region 201 constituting a first photoelectric conversion element and an N-type semiconductor region 202 constituting a second photoelectric conversion element are provided in the active region 220. In the same way, an N-type semiconductor region 203 constituting a first photoelectric conversion element and an N-type semiconductor region 204 constituting a second photoelectric conversion element are provided in the active region 221. The N-type semiconductor regions 201 through 204 function as charge accumulation regions of the photoelectric conversion element. The N-type semiconductor regions 201 through 204 are formed having rectangular shapes. Note that no isolating portion is provided between the semiconductor region 201 and semiconductor region 202, nor between the semiconductor region 203 and semiconductor region 204.

Also, FIG. 2B illustrates an N-type semiconductor region 209 and N-type semiconductor region 210 provided in the active region 220, and an N-type semiconductor region 211 and N-type semiconductor region 212 provided in the active region 221. These N-type semiconductor regions 209 through 212 each function as FD regions constituting a part of an FD node. In the present embodiment, one FD region is provided to each photoelectric conversion element, FD regions are electrically connected by wiring. An isolating portion is provided between the semiconductor region 209 and the semiconductor region 210. Providing FD regions to each enable the capacity of the FD regions to be reduced.

Further, FIG. 2B illustrates gate electrodes 205 through 208 of the transfer transistors having been provided in the active region 220 or the active region 221. The gate electrode 205 is positioned within the active region 220, and is positioned between the semiconductor region 201 and the semiconductor region 209. Other gate electrodes 206 through 208 are similarly positioned between the semiconductor regions 202 through 204 and the semiconductor regions 210 through 212. The gate electrodes are provided above the semiconductor substrate. At least one part of the semiconductor substrate below the gate electrodes positioned in the active regions serves as a transfer path. The region 241 is positioned between the gate electrode 205 and gate electrode 206, and gate electrode 207 and gate electrode 208. It could be said that the region 241 is positioned between two FD regions provided to the same active region.

In FIG. 2B, a separate active region 222 is illustrated being provided with an amplifying transistor, reset transistor, and selecting transistor. A gate electrode 213 of the amplifying transistor, a gate electrode 214 of the reset transistor, and a gate electrode 215 of the selecting transistor are provided, and the sources and drains thereof are configured including partially-common semiconductor regions. The N-type semiconductor region 216 is a source of an amplifying transistor, and also is a drain of a selecting transistor. The N-type semiconductor region 217 is a drain of an amplifying transistor, and also is a drain of a reset transistor. The N-type semiconductor region 218 is a source of a reset transistor, and is electrically connected to the FD node 111 illustrated in FIG. 1. The N-type semiconductor region 219 is a source of a selecting transistor, and is electrically connected to the signal line 117 illustrated in FIG. 1. Note that the sources and drains of the transistors may be configured using other semiconductor regions.

Figure 3A:
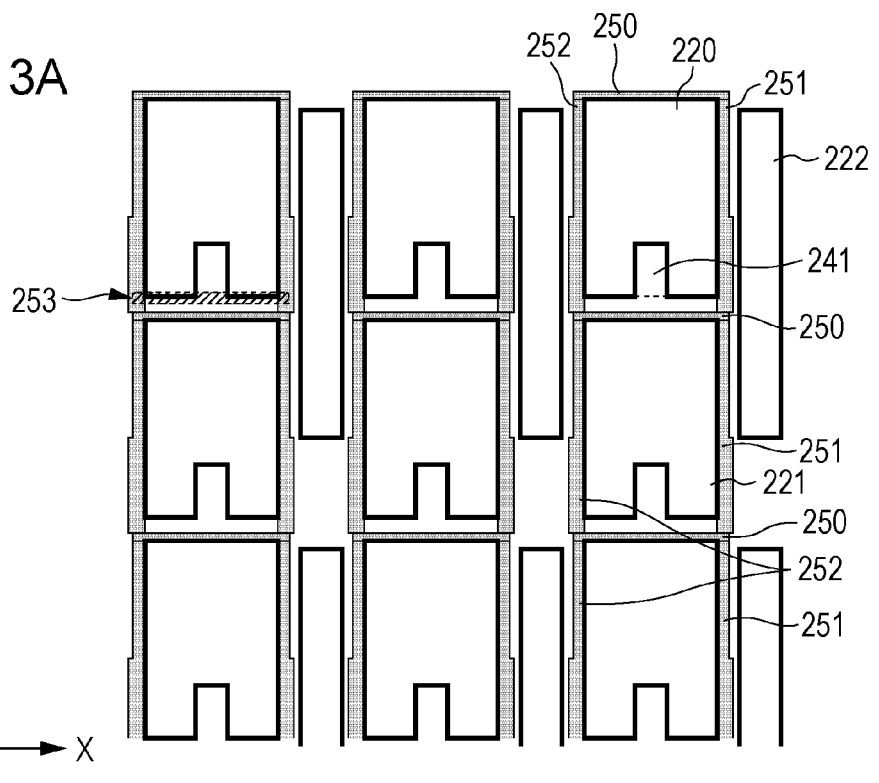
FIGS. 3A and 3B are schematic plan views illustrating the photoelectric conversion device according to the first embodiment.
Figure 3B:
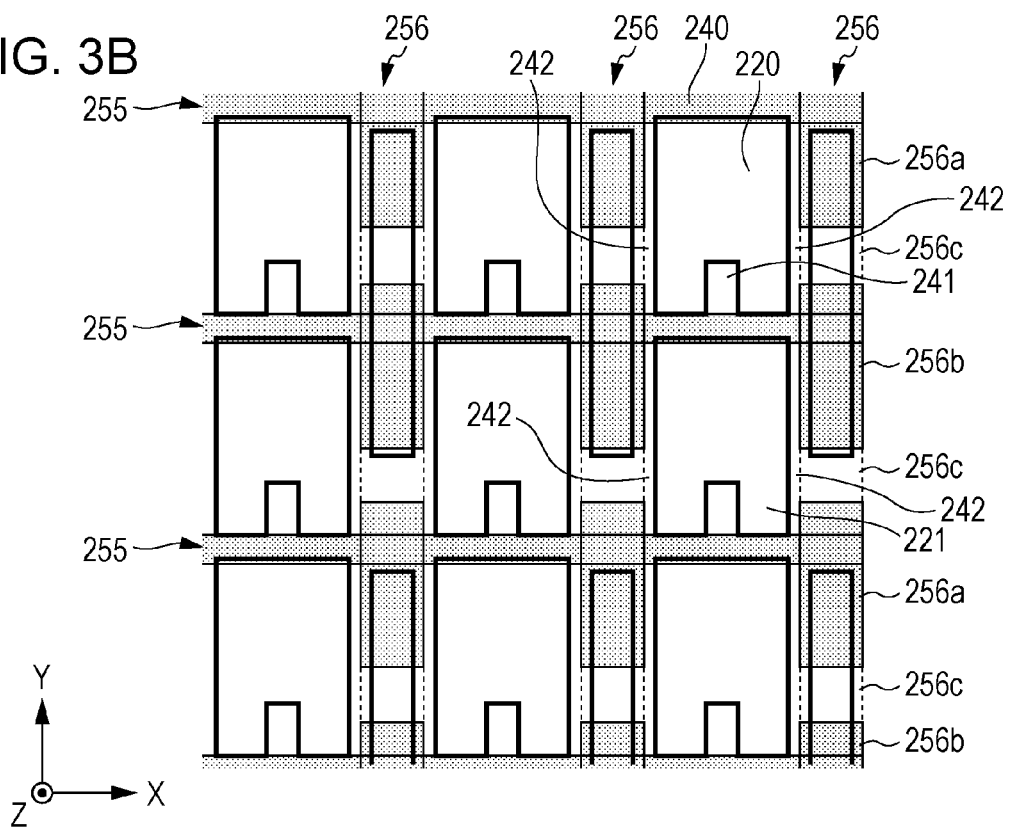

FIGS. 3A and 3B are schematic plan views illustrating the P-type semiconductor region in addition to what is illustrated in FIG. 2A. FIG. 3A illustrates P-type semiconductor regions 250 through 252, and FIG. 3B illustrates P-type semiconductor regions 255 and 256.

As illustrated in FIG. 3A, active regions 220 and 221 are surrounded by the P-type semiconductor regions 250 through 252 (fifth semiconductor region). The semiconductor regions 250 through 252 are positioned on three sides of the active regions 220 and 221 where the photoelectric conversion elements are formed. The semiconductor regions 250 through 252 are integral, in the shape of a ladder. The semiconductor regions 250 through 252 have been disposed within the semiconductor substrate, of the same impurity concentration and at the same depth. The semiconductor regions 250 through 252 are provided so as to cover the outer edge of the isolating portion, to reduce noise which occurs at defects existing between the insulator constituting the isolating portion and the semiconductor. The semiconductor regions 250 through 252 are not provided to the region 241 positioned between the gate electrodes of the active regions 220 and 221. The semiconductor regions 250 through 252 are not provided between the FD regions of the active regions 220 and 221, either. It is sufficient for the semiconductor regions 250 through 252 to be provided to portions of the region 241 and region 242 in contact with the transfer path, i.e., where the isolating portion and gate electrodes overlap. It is sufficient for the semiconductor regions 250 through 252 to be at least not provided to the region 200. Accordingly, the semiconductor regions 250 through 252 may be provided to the region 253 defining the active regions where the FD regions are provided, which is part of the isolating portion but not in contact with the transfer path. The semiconductor regions 250 through 252 are formed by ion implantation using a mask, which will be described in detail later.

As illustrated in FIG. 3B, the P-type semiconductor regions 255 and 256 (seventh semiconductor region) are provided so as to surround the active region 220 and active region 221. The semiconductor region 255 has a band-like shape following the X axis direction. The semiconductor region 256 has a band-like shape following the Y axis direction. In the present embodiment, the semiconductor region 256 is configured including a partial gap region 256c, a semiconductor region 256a, and a semiconductor region 256b. This gap region 256c does not have to be provided, so the semiconductor region 255 and semiconductor region 256 may form a lattice shape. The gap may be provided to adjust the amount of charge crosstalk to vertically and horizontally adjacent pixels in FIG. 3B. The semiconductor regions 255 and 256 have been disposed within the semiconductor substrate, of the same impurity concentration and at the same depth. The semiconductor regions 255 and 256 are provided within the semiconductor substrate below the insulator of the isolating portion, to function as a potential barrier as to signal charges. The semiconductor regions 255 and 256 are not provided to the region 241. Particularly, it is sufficient for the semiconductor regions 255 and 256 to be at least not provided to the region 200, which is the outer edge of the isolation portion positioned between the active regions. The semiconductor regions 255 and 256 are formed by ion implantation using a mask, which will be described in detail later.

Figure 4:
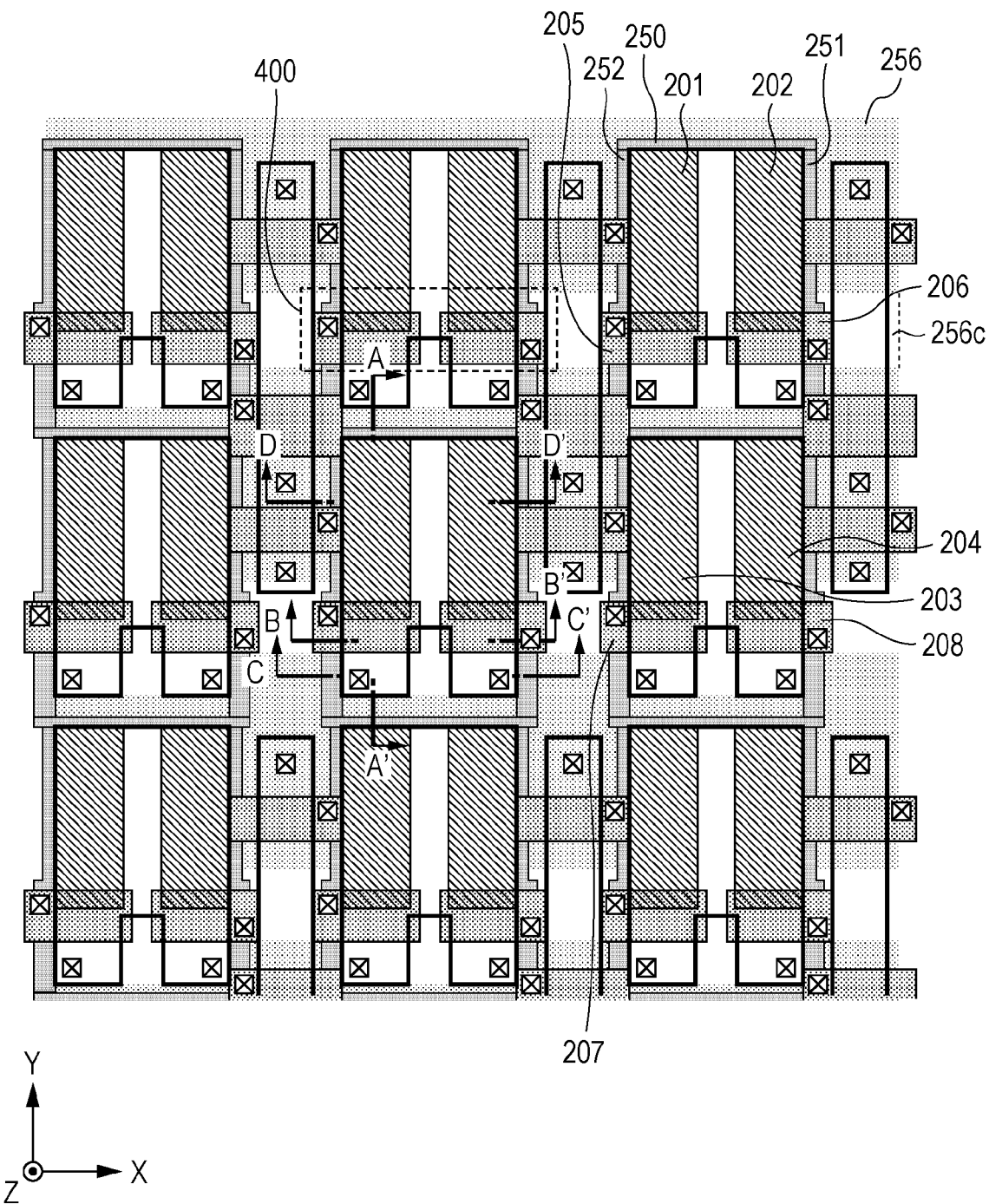
FIG. 4 is a schematic plan view illustrating the photoelectric conversion device according to the first embodiment.

FIG. 4 is an illustration where the components of FIGS. 2A through 3B are overlaid, and is a schematic plan view illustrating the primary configurations of the photoelectric conversion device according to the present embodiment. The configurations of the photoelectric conversion device according to the present embodiment at the cross-sections taken along line A-A', line B-B', line C-C', and line D-D', will be described with reference to FIGS. 5A through 5D.

Figure 5A:
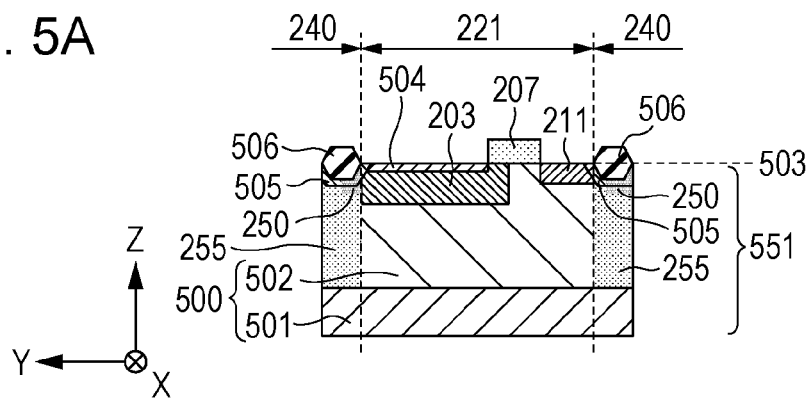
FIGS. 5A through 5D are schematic cross-sectional views illustrating the photoelectric conversion device according to the first embodiment.
Figure 5B:
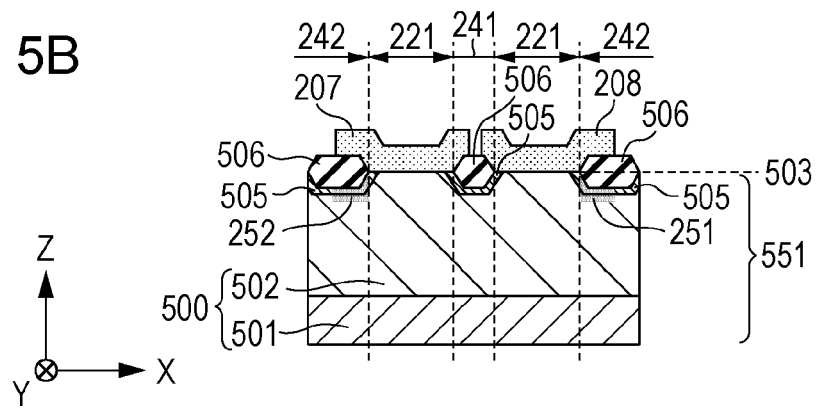
Figure 5C:
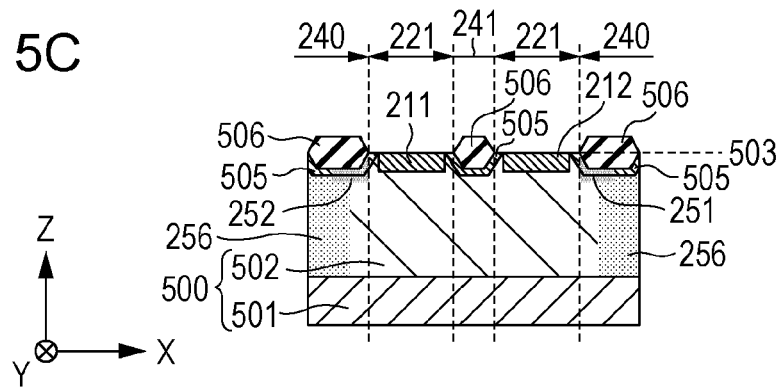
Figure 5D:
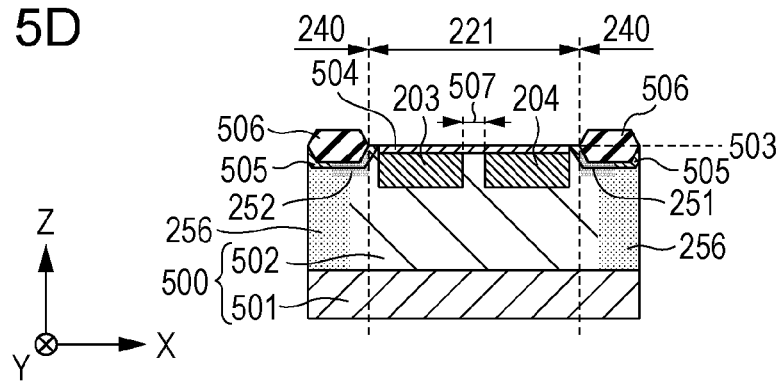

FIG. 5A is a schematic cross-sectional view taken along line A-A' in FIG. 4, FIG. 5B is a schematic cross-sectional view taken along line B-B' in FIG. 4, FIG. 5C is a schematic cross-sectional view taken along line C-C' in FIG. 4, and FIG. 5D is a schematic cross-sectional view taken along line D-D' in FIG. 4.

FIGS. 5A through 5D illustrate a semiconductor substrate 500 which has a surface 503, an N-type semiconductor region 501, and a P-type semiconductor region 502. This semiconductor region 502 is also referred to as a well. This semiconductor substrate 500 includes a first portion which will later become an active region, and a second portion which will later become an isolating portion. The second portion includes a first region, and a second region which is other than the first region. In FIG. 5A, an N-type semiconductor region 203 and a P-type semiconductor region 504 (eighth semiconductor region, ninth semiconductor region) positioned above the semiconductor region 203, constitute a photoelectric conversion element. A gate electrode 207 is positioned between the semiconductor region 203 and the semiconductor region 211 which is an FD region. FIG. 5B illustrates a portion including the gate electrode 207 and gate electrode 208. FIG. 5C illustrates a portion including semiconductor regions 211 and 212, which are FD regions. FIG. 5D illustrates a portion including two photoelectric conversion elements. The semiconductor region 203 and semiconductor region 504 constitute photoelectric conversion element, and the semiconductor region 204 and semiconductor region 504 constitute a separate photoelectric conversion element. Here, the semiconductor region 504 is formed continuously from one photoelectric conversion element to another photoelectric conversion element. A region 507 exists between the semiconductor region 203 and semiconductor region 204, isolating the semiconductor region 203 and semiconductor region 204. A part of the semiconductor region 504 and semiconductor region 502 are in contact with the region 507. The bottom faces of the semiconductor regions 211 and 212 are at a shallower position in the semiconductor substrate as compared to the bottom face of the semiconductor region 250, and the bottom face of the semiconductor region 250 is at a shallower position in the semiconductor substrate as compared to the bottom face of the semiconductor region 203. The expression saying that one bottom face is at a deeper position in the semiconductor substrate than another bottom face can be rephrased to say that one bottom face is farther from the surface 503 as compared to the other bottom face. Note that a P-type semiconductor region may further be provided to the region 507 for stronger isolation between the semiconductor region 203 and semiconductor region 204.

An isolating portion 506 formed of an insulator is provided to the regions 240, 241, and 242 which are the second portion, as illustrated in FIGS. 5A through 5D. A P-type semiconductor region 505 (sixth semiconductor region) is provided below the isolating portion 506, so as to cover the bottom face of the isolating portion 506. The semiconductor region 505 functions as a channel stop. The semiconductor region 505 is formed by the same mask as the isolating portion 506, which will be described later in detail.

Placement of the P-type semiconductor region will be described in detail. The region 240 in FIG. 5A includes the semiconductor region 505, semiconductor region 250, and semiconductor region 255. The region 242 in FIG. 5B includes the semiconductor region 505, semiconductor region 251, and semiconductor region 252. Only the semiconductor region 505 is included in the region 241 in FIG. 5C. The region 240 in FIG. 5C includes the semiconductor region 505, semiconductor region 251, semiconductor region 252, and semiconductor region 256. The region 240 in FIG. 5D includes the semiconductor region 505, semiconductor region 251, semiconductor region 252, and semiconductor region 256. In FIGS. 5A through 5D, more P-type semiconductor regions are positioned in the region 240 as compared to the region 241. Accordingly, the concentration of impurity constituting the P-type semiconductor region (hereinafter, P-type impurity) beneath the isolating portion in the region 240 is higher than the P-type impurity concentration beneath the isolating portion in the region 241. Also, the P-type impurity concentration beneath the isolating portion in the region 240 is higher than the P-type impurity concentration beneath the isolating portion in the region 242. That is to say, the P-type impurity concentration beneath the isolating portion in the region 241 and the P-type impurity concentration beneath the isolating portion in the region 242 are lower than the P-type impurity concentration beneath the isolating portion in the region 240. Particularly, the P-type impurity concentration beneath the isolating portion in the region 200 is preferably lower than the P-type impurity concentration beneath the isolating portion in the region 240. Lowering the P-type impurity concentration in portions adjacent to the gate electrode transfer paths allows the effective transfer path width formed by applying voltage, to turn the transistor on, to the gate electrodes. This configuration enables broadening the effective width of transfer paths of transfer transistors while reducing noise to the photoelectric conversion elements, thereby enabling improved transfer efficiency. This configuration also enables diffusion of P-type impurities to the transfer path, and variance in transfer transistor threshold values and transfer transistor transfer path width to be reduced. While reducing the P-type impurity concentration in the semiconductor substrate beneath the isolating portion in the region 242 is also preferable, it is sufficient to reduce the P-type impurity concentration in at least the region 241, particularly the region 200, out of the parts coming into contact with transfer path, so as to be lower than the P-type impurity concentration in the region 240. Further lowering the P-type impurity concentration between FD regions in the region 241 enables the PN junction capacitance of the FD regions to be reduced.

Also, the semiconductor regions 250 through 252, 255, and 256, formed by a different mask from the mask forming the isolating portion 506 are not provided to the region 241, and particularly not to the region 200. This enables influence of mask formation positioning error on the transfer paths to be reduced.

Figure 6C:
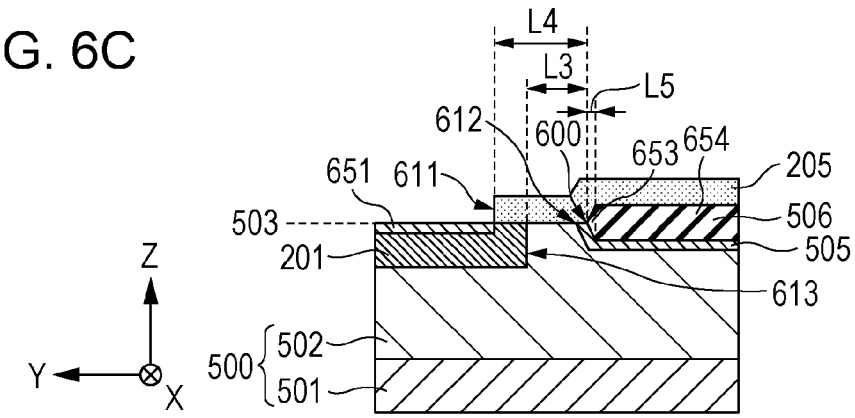
Figure 6D:
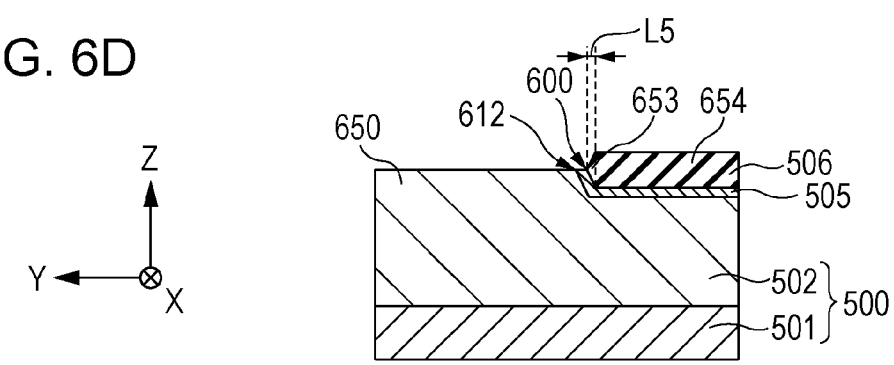

The configuration around the gate electrodes, including the region 241, will be described with reference to FIGS. 6A through 6D. FIG. 6A is a schematic enlarged plan view of region 400 in FIG. 4. FIG. 6B is a schematic cross-sectional view taken along line VIB-VIB in FIG. 6A, FIG. 6C is a schematic cross-sectional view taken along line VIC-VIC in FIG. 6A, and FIG. 6D is a schematic cross-sectional view taken along line VID-VID in FIG. 6A.

As illustrated in FIG. 6A, the semiconductor region 251 and semiconductor region 252 are provided in the region 240, but not in the region 241. This configuration enables property variance of the transfer transistor to be suppressed. Also, a part of the side 600 of the isolating portion 506 in the region 200 is positioned beneath the gate electrode 205 and gate electrode 206. Note that the isolating portion 506 is not provided in the region 650 between the semiconductor region 201 and semiconductor region 202; rather, the semiconductor region 502 illustrated in FIGS. 5A through 5D is positioned at that position. The isolating portion 506 has sides 605 and 606 which continue from the side 600. These sides 600, 605, and 606 constitute the outer edge of the isolating portion 506. The sides 605 and 606 constitute the outer edge of the active region 220. The region 200 is the portion where the side 605 and gate electrode 205 overlap, and where the side 606 and gate electrode 206 overlap, in plan view. The gate electrode 205 has the side 601 of the semiconductor region 201 and side 602 of the semiconductor region 209. The gate electrode 206 has the side 603 of the semiconductor region 202 and side 604 of the semiconductor region 210. The lengthwise length of the transfer path of the gate electrode 205 is the distance between side 601 and side 602, and is length L1. The lengthwise length of the transfer path of the gate electrode 206 is the distance between side 603 and side 604, and also is length L1.

Figure 7:
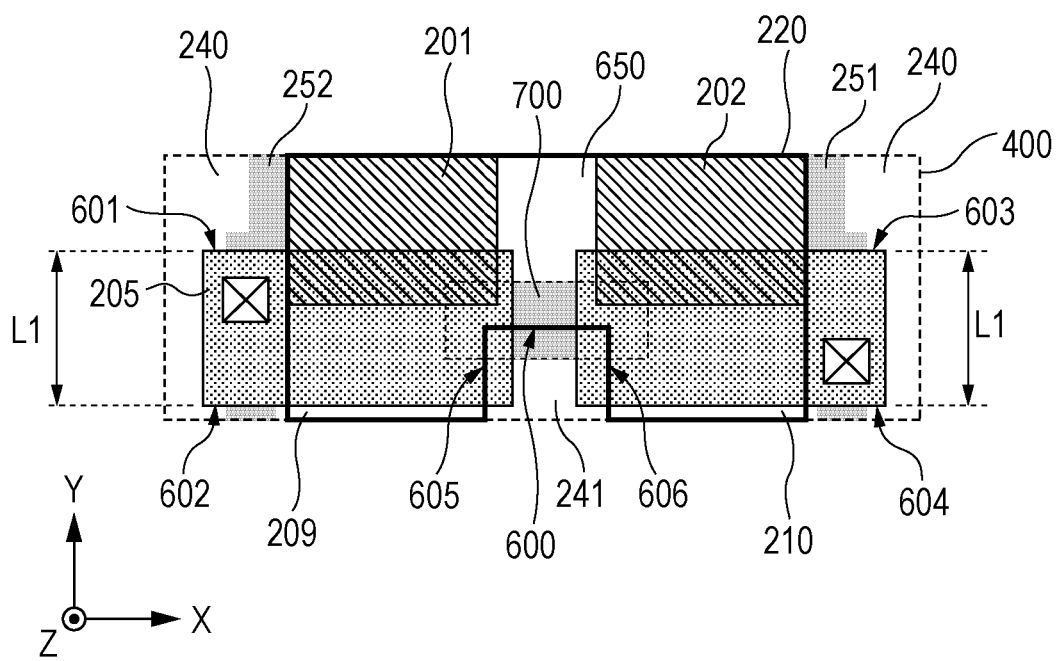
FIG. 7 is a schematic plan view for describing the photoelectric conversion device according to the first embodiment.

Now, description will be made regarding a case where a P-type semiconductor region 700 is formed at the position of the region 241, for the sake of comparison. FIG. 7 is a comparative schematic plan view, corresponding to FIG. 6A. As can be seen from FIG. 7, providing the P-type semiconductor region 700 at the region 200 or side 600 of the isolating portion results in the P-type semiconductor region 700 markedly extending to the transfer path constituted by the gate electrodes 205 and 206. This may result in the width of the transfer path of the transfer transistor becoming narrower. Further, the threshold value at the gate electrode 205 and gate electrode 206, and the transfer path width thereof change, resulting in the transfer transistor properties changing. On the other hand, it can be seen that the configuration illustrated in FIG. 6A prevents the transfer path from becoming narrow, and suppresses variance in transistor properties.

As illustrated in FIG. 6B, the side 610 of the semiconductor region 201 exists at the same position as a side 607 of the isolating portion 506. The semiconductor region 252 is provided so as to cover the edge of the isolating portion 506. FIG. 6B illustrates an edge 609 of the semiconductor region 252 extending past the side 607 of the isolating portion 506 toward the active region side by a length L2. This length L2 is, for example, 0.10 μm. This configuration enables noise due to the isolating portion 506 to be suppressed from entering the photoelectric conversion element. A side 608 of a semiconductor region 505 positioned below the isolating portion 506 is positioned between the side 607 of the isolating portion 506 and a side 609 of the semiconductor region 252. This configuration enables noise to be reduced even further. The side 607 and side 608 form sides following the Y direction, though they appear as dots in FIG. 6B. Hereinafter, in a case where similar configurations are illustrated in schematic cross-sectional views as dots, these will be referred to as "sides".

The positional relationship between the gate electrode 205 and the isolating portion 506 and the semiconductor region 201 will be described with reference to FIG. 6C. A side 613 of the semiconductor region 201 is positioned at a position L3 in length away from the side 600 of the isolating portion 506. The length L3 is 0.25 μm, for example. Offsetting by the length L3 enables reduction in noise due to the isolating portion 506 from entering the semiconductor region 201, thus preventing the noise from entering the photoelectric conversion element. Particularly, unlike the portion illustrated in FIG. 6B, no semiconductor region equivalent to the P-type semiconductor region 252 is provided at the portion illustrated in FIG. 6C, so noise at the isolating portion 506 needs to be dealt with. Applying the configuration illustrated in FIG. 6C enables both reduction of effects of noise on the transfer path and reduction of noise to be realized.

Also, a side 611 of the gate electrode 205 is positioned at a position distanced from the side 600 by a length L4, which is longer than the length L3. The length L4 is 0.35 µm, for example. Providing the gate electrode 205 on the semiconductor region 201 allows transfer efficiency to be improved. The isolating portion 506 includes a portion 653 having a length L5 and remaining portion 654. The portion 653 is a part also referred to as a "bird's beak". The side 600 of the isolating portion 506 forms an outer edge of the isolating portion 506 and indicates the outer edge of the portion 653. A P-type semiconductor region 651 is positioned at a position distanced from the side 600 by a length L4, but may be positioned even farther away. FIG. 6D illustrates a configuration generally the same as that in FIG. 6C, but a region 650 to separate the two photoelectric conversion elements has been provided.

A manufacturing method of the photoelectric conversion device according to the present embodiment will be described with reference to FIGS. 8A through 8H. FIGS. 8A through 8H are each schematic cross-sectional diagrams taken along line A-A' in FIG. 4, and correspond to FIG. 5A. Detailed description relating to general semiconductor manufacturing processes will be omitted here.

Figure 8A:
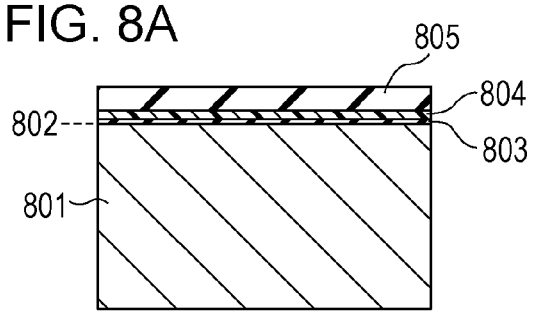
FIGS. 8A through 8H are schematic cross-sectional views illustrating a manufacturing method of the photoelectric conversion device according to the first embodiment.

First, in FIG. 8A, a semiconductor substrate 801 is prepared. This semiconductor substrate 801 is, for example, an N-type silicon semiconductor substrate. The semiconductor substrate 801 has a first portion which will later become an active region, and a second portion which will later become an isolating portion. The second portion includes a first region, and a second region which is the rest. A silicon oxide film 803, polysilicon film 804, and a silicon nitride film 805 are layered on the surface 802 of the semiconductor substrate 801, in that order. The thickness of the silicon oxide film 803 is 10 nm to 30 nm, the thickness of the polysilicon film 804 is 40 nm to 60 nm, and the thickness of the silicon nitride film 805 is 200 nm to 300 nm, for example, these films are used to form an insulating isolating portion by local oxidation of silicon (LOCOS).

Figure 8E:
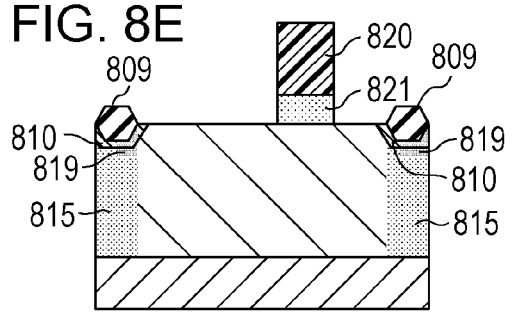
Figure 8B:
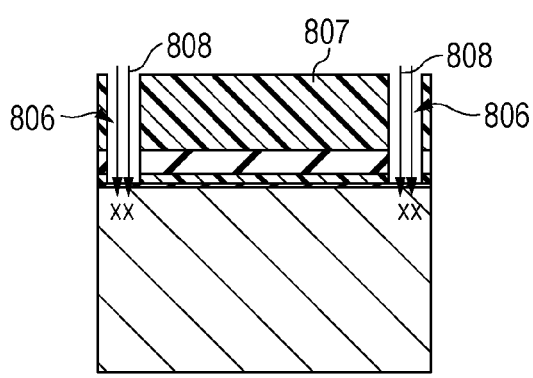
Figure 8F:
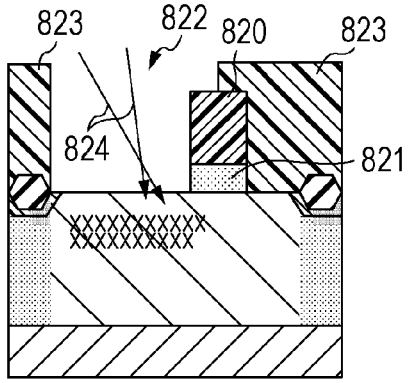
Figure 8C:
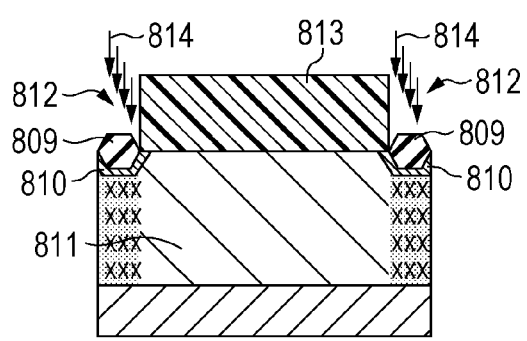

As illustrated in FIG. 8B, a photoresist pattern 807 having openings 806 is formed. The openings 806 expose the second portion. Masking this resist pattern and dry etching removes part of the silicon oxide film 803, polysilicon film 804, and silicon nitride film 805. The portion of the semiconductor substrate 801 which has been exposed by the part of the silicon oxide film 803, polysilicon film 804, and silicon nitride film 805 having been removed is subjected to ion implantation 808 of boron, for example. This ion implantation 808 is performed under the conditions of acceleration energy of 60 KeV to 100 KeV, dosage of $1.5 \times 10^{12}$ cm$^{-2}$ to $1.5 \times 10^{12}$ cm$^{-2}$, and implantation angle of 0 degrees. The implantation angle refers to the angle from the normal line at the surface of the semiconductor substrate 801. This process forms semiconductor regions 810. The photoresist pattern 807 is removed, following which oxidization involving thermal treatment at 800° C. or higher, for example, thereby forming an isolating portion 809 (FIG. 8C). The semiconductor regions 810 function to reduce noise due to defects at the interface between the isolating portion 809 and semiconductor substrate 801 from entering the photoelectric conversion element. The isolating portion 809 has been described as being formed by LOCOS, but may be formed by shallow trench isolation (STI). When applying STI, a groove (trench) is formed corresponding to the portion of the semiconductor substrate 801 where the silicon oxide film 803, polysilicon film 804, and silicon nitride film 805 have been removed, and ion implantation 808 is performed at a greater angle than with LOCOS.

Figure 8G:
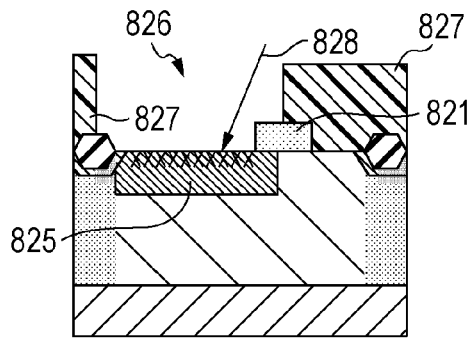
Figure 8D:
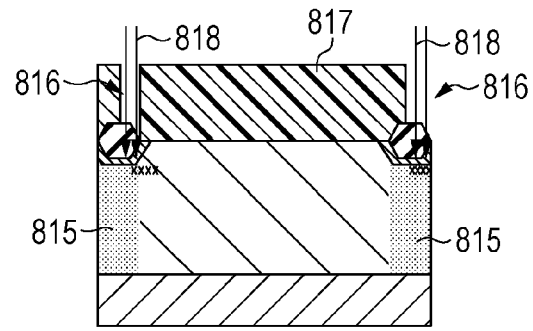

Next, boron ion implantation is performed to form a semiconductor region 811 to serve as a P-type well (not illustrated). Thereafter, a photoresist pattern 813 having openings 812 is formed as illustrated in FIG. 8C. The photoresist pattern 813 is used to perform boron ion implantation 814 to the semiconductor substrate 801. This ion implantation 814 is performed under the conditions of acceleration energy of 350 KeV to 1.5 MeV, dosage of $0.8 \times 10^{13}$ cm$^{-2}$ to $2.0 \times 10^{13}$ cm$^{-2}$, and implantation angle of 0 degrees, and is performed four times under differing acceleration energy. The ion implantation 814 is performed under greater acceleration energy than the ion implantation 808. This ion implantation 814 forms a P-type semiconductor region 815 (FIG. 8D). This semiconductor region 815 functions to separate signal charges from the adjacent photoelectric conversion element.

A photoresist pattern 817 having openings 816 is formed as illustrated in FIG. 8D. Boron ion implantation 818 is performed on the semiconductor substrate 801 using the photoresist pattern 817 as a mask. This ion implantation 818 is performed under the conditions of acceleration energy of 90 KeV to 140 KeV, dosage of $1.0 \times 10^{13}$ cm$^{-2}$ to $2.0 \times 10^{13}$ cm$^{-2}$, and implantation angle of 0 degrees. This ion implantation 818 forms a P-type semiconductor region 819 (FIG. 8E). This semiconductor region 819 functions to reduce noise from the isolating portion 809.

Next, oxidizing and nitriding is performed to form a film serving as a gate insulating film. A polysilicon film to serve as a gate electrode is formed on the gate insulating film. Thereafter, the polysilicon film is subjected to dry etching using a photoresist pattern 820 as a mask, thereby forming a gate electrode 821 (FIG. 8E). A gate insulating film (not illustrated) of silicon oxide or silicon nitride is formed between the gate electrode 821 and the surface 802.

Next, a photoresist pattern 823 having an opening 822 corresponding to the portion where the photoelectric conversion element is to be formed, is formed on the photoresist pattern 820. The photoresist pattern 823 and photoresist pattern 820 and gate electrode 821 are used as a mask to perform arsenic ion implantation (FIG. 8F). Ion implantation 824 is performed twice in the present embodiment. The first ion implantation is performed under the conditions of acceleration energy of 400 KeV to 600 KeV, dosage of $3.5 \times 10^{12}$ cm$^{-2}$ to $5.0 \times 10^{12}$ cm$^{-2}$, and implantation angle of 0 degrees to 7 degrees. The second ion implantation is performed under the conditions of acceleration energy of 300 KeV to 400 KeV, dosage of $0.8 \times 10^{12}$ cm$^{-2}$ to $2.0 \times 10^{12}$ cm$^{-2}$, and implantation angle of 15 degrees to 45 degrees. The direction of the ion implantation 824 performed twice to the X-Y plane is in the Y-axial direction in both cases, toward the gate electrode. The two ion implantations 824 form an N-type semiconductor region 825 (FIG. 8G). The semiconductor region 825 constitutes a part of the photoelectric conversion element, and functions as a so-called charge storage region.

Figure 8H:
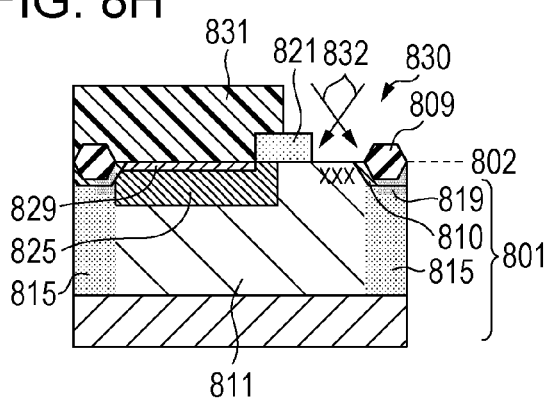

Next, the photoresist pattern 820 and the photoresist pattern 823 are removed, and a new photoresist pattern 827 having an opening 826 is formed. Boron ion implantation 828 using the photoresist pattern 827 as a mask. The ion implantation 828 is performed under the conditions of acceleration energy of 10 KeV to 20 KeV, dosage of $5.0 \times 10^{13}$ cm$^{-2}$ to $1.0 \times 10^{14}$ cm$^{-2}$, and implantation angle of 20 degrees to 35 degrees. The direction of the ion implantation 828 performed to the X-Y plane is in the Y-axial direction, from the gate electrode 821 toward the isolating portion 809. The ion implantation 828 forms a P-type semiconductor region 829 within the N-type semiconductor region 825 (FIG. 8H). The semiconductor region 829 is provided to realize a photodiode, which is the photoelectric conversion element, as a buried type photodiode.

Subsequently, a photoresist pattern 831 is formed having an opening 830 corresponding to the portion where the FD region is to be formed, and phosphorous ion implantation 832 is performed using the photoresist pattern 831 as a mask. The ion implantation 832 forms an N-type semiconductor region to serve as the FD region. Note that here, the semiconductor regions 811, 815, and 810 in FIG. 8H correspond to the semiconductor regions 502, 255, and 505 in FIG. 5A. The semiconductor region 819 in FIG. 8H corresponds to the semiconductor region 251 or 252 in FIG. 5A, and the isolating portion 809 in FIG. 8H corresponds to the isolating portion 506 of the insulator in FIG. 5A. The semiconductor region 825, semiconductor region 829, and gate electrode 821 in FIG. 8H correspond to the semiconductor region 203, semiconductor region 504, and gate electrode 207 in FIG. 5A, respectively. Subsequently, interlayer insulating film, wiring, optical members, and so forth, are formed, thus completing the photoelectric conversion device. The photoelectric conversion device according to the present embodiment can be fabricated in this way.

Figure 9A:
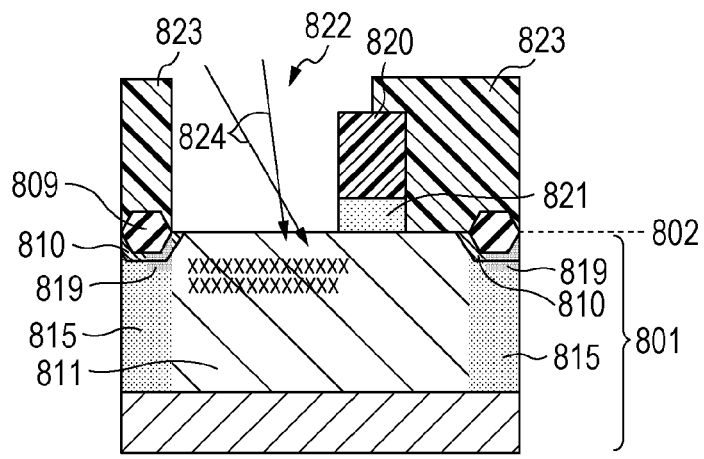
FIG. 9A is a schematic cross-sectional view illustrating the manufacturing method of the photoelectric conversion device according to the first embodiment.
Figure 9B:
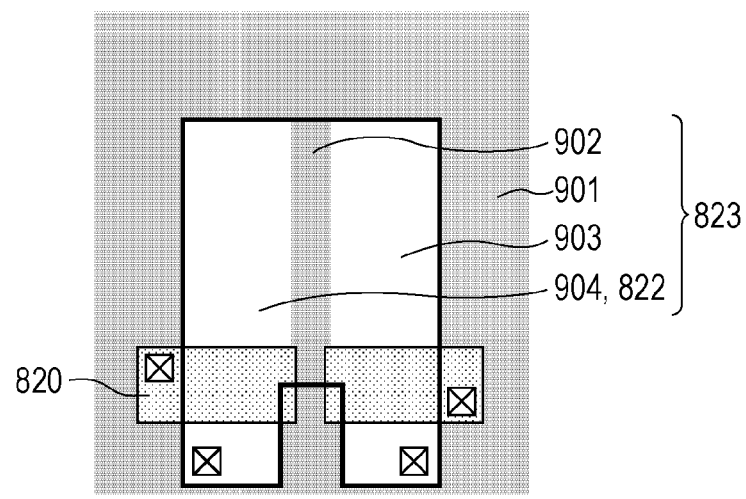
FIGS. 9B and 9C are schematic plan views illustrating the manufacturing method of the photoelectric conversion device according to the first embodiment.

The processes of FIGS. 8F and 8G will be described in detail with reference to FIGS. 9A through 9C. FIG. 9A corresponds to FIG. 8F, and FIG. 9B is a schematic plan view corresponding to FIG. 9A. As illustrated in FIG. 9B, the photoresist pattern 823 includes a frame-shaped portion 901 surrounding the active region 221, a wall-shaped portion (hereinafter, "wall portion") 902 provided to a part of the active region 221, an openings 903 and 904 exposing portions where the N-type semiconductor region has been formed. Ion implantation 824 illustrated in FIG. 9A is performed as to the semiconductor substrate 801 using this photoresist pattern 823 as a mask, thereby forming two N-type semiconductor regions. the two semiconductor regions correspond to the semiconductor region 203 and semiconductor region 204 illustrated in FIG. 4. Having this wall portion 902 means that ions are not implanted to a part of the active region 221 during the ion implantation 824, so a part of the semiconductor region 811 exists. Accordingly, the process of providing a potential barrier between the two N-type semiconductor regions can be omitted.

Figure 9C:
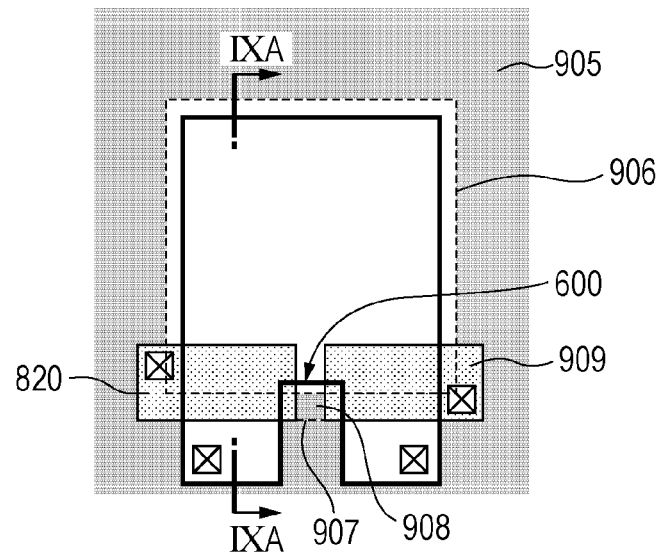

FIG. 9C is a schematic plan view of the portion corresponding to FIG. 8G. The photoresist pattern 827 illustrated in FIG. 8G has a frame-shaped portion illustrated in FIG. 9C, and an opening 906 exposing the portion where the P-type semiconductor region has been formed. The opening 906 has a protrusion 908, and the frame-shaped portion 905 has a recess portion 907 corresponding to the protrusion 908. The protrusion 908 is between the gate electrode 821 (gate electrode 207 in FIG. 4) and gate electrode 909 (gate electrode 208 in FIG. 4), and is formed from the portion where the P-type semiconductor region is formed, past the side 600 of the isolating portion, and protruding toward the isolating portion. The protrusion 908 exposes the isolating portion positioned between gate electrodes. Providing the opening 906 with this protrusion 908 causes the ion implantation 828 in FIG. 8G to be performed between the gate electrodes, a P-type semiconductor region is formed near the side 600 of the isolating portion, and the semiconductor region is extended. Forming the P-type semiconductor region at the side 600 of the isolating portion allows the isolating performance between the gate electrodes to be improved. The ion implantation 828 is performed so as to match the gate electrodes, so there is little error in positioning, and transfer path variance does not readily occur.

The manufacturing method of the structure at line C-C' in FIG. 4 will be described with reference to FIGS. 10A through 10D, which are schematic cross-sectional views taken along this line C-C'. FIGS. 10A through 10D each correspond to FIG. 5B. Detailed description of parts already described regarding FIGS. 8A through 8H, and general semiconductor manufacturing processes, will be omitted here.

Figure 10A:
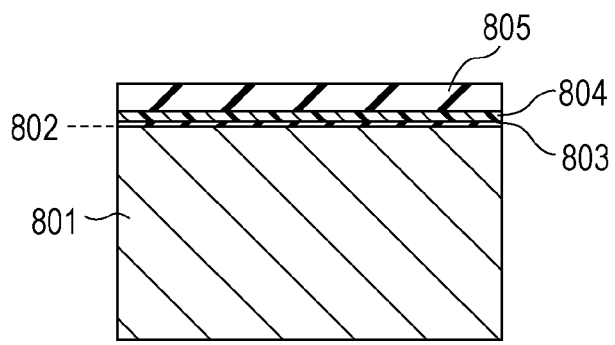
FIGS. 10A through 10D are schematic cross-sectional views illustrating the manufacturing method of the photoelectric conversion device according to the first embodiment.
Figure 10B:
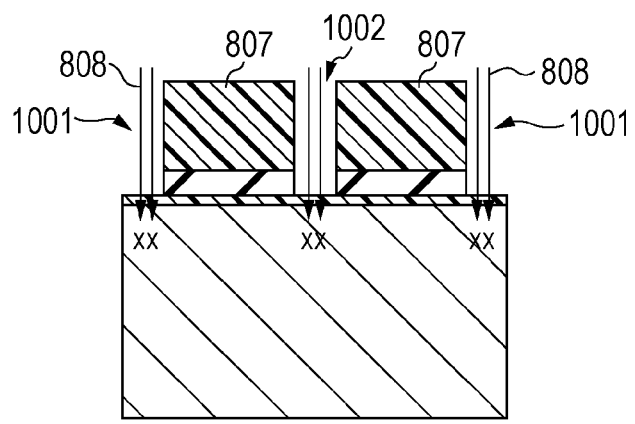

FIG. 10A is a drawing which corresponds to FIG. 8A. First, the semiconductor substrate 801 is prepared. FIG. 10B corresponds to FIG. 8B. The photoresist pattern 807 having an opening 1001 and opening 1002 in addition to the opening 806 in FIG. 8B, is formed. Dry etching is performed using this photoresist pattern 807 as a mask, and part of the silicon oxide film 803 and polysilicon film 804 is removed. Ion implantation 808 is performed through the opening 1001 and opening 1002.

Figure 10C:
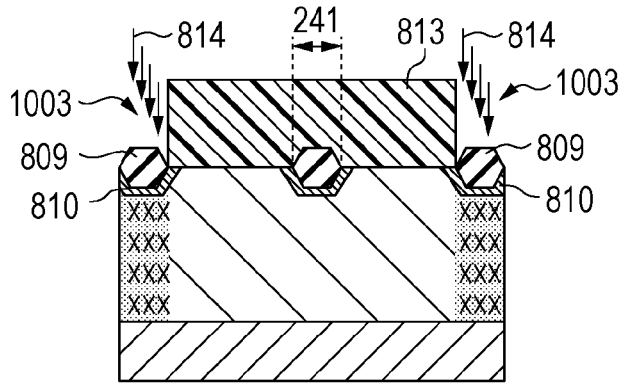

FIG. 10C is a drawing which corresponds to FIG. 8C. Ion implantation 814 is performed further using the photoresist pattern 813 having an opening 1003 as a mask. The photoresist pattern 813 here is formed is as to cover the portion corresponding to the region 241. This ion implantation forms the semiconductor region 815. This semiconductor region 815 corresponds to the semiconductor region 256 in FIG. 5C.

Figure 10D:
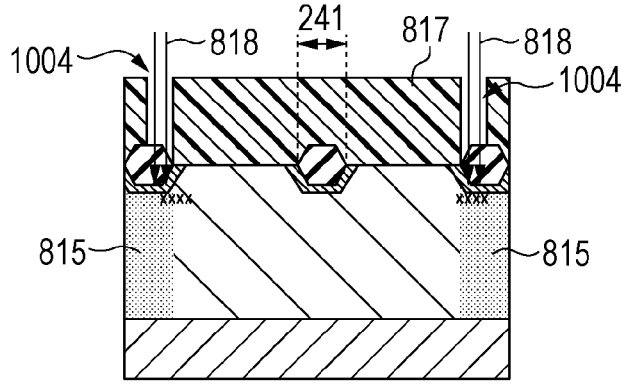

FIG. 10D is a drawing which corresponds to FIG. 8D. Ion implantation 818 is performed further using the photoresist pattern 817 having an opening 1004 as a mask. The photoresist pattern 817 here is formed is as to cover the portion corresponding to the region 241. This forms the semiconductor region 819 (not illustrated). This semiconductor region 819 corresponds to the semiconductor regions 251 and 252 in FIG. 5C. Subsequently, gate electrodes, interlayer insulating film, wiring, optical members, and so forth, are formed, thus completing the photoelectric conversion device.

The manufacturing method of the structure at line B-B' in FIG. 4 can be performed by not providing an opening for the portions of the photoresist pattern 813 and photoresist pattern 817 in the processes in FIGS. 10C and 10D, which are schematic cross-sectional views. After the process in FIG. 10B, gate electrodes may be formed at portions corresponding to the B-B' in FIG. 4. The photoelectric conversion device according to the present embodiment may be formed in this way.

The transfer paths of the transfer transistors are portions where the active regions 220 and 221 overlap the gate electrodes 205 through 208. There are cases where the transfer paths are not formed, or are not readily formed, if there is a P-type semiconductor region formed beneath the gate electrodes 205 through 208. The positions of the active regions 220 and 221 are decided by the outer edge of the isolating portion 506. Accordingly, the positional relation between the isolating portion 506 and P-type semiconductor region is preferably controlled at a high accuracy, from the perspective of deciding the transfer paths. However, the semiconductor regions 250 through 252, 255, and 256 in FIGS. 5A through 5C are formed by ion implantation using a photoresist pattern mask. Exposure by a semiconductor exposure device is necessary to form the photoresist pattern, and error in positioning at the exposure device results in variance in transfer paths, and causes variance in transfer transistor properties. Occurrence of variance in the transfer paths can be reduced by not forming the semiconductor regions 250 through 252, 255, and 256 at portions coming into contact with portions to become transfer paths, the region 241 for example.

Note that the semiconductor region 505 uses the same photoresist pattern as when forming the isolating portion 506, so positioning error does not occur. Accordingly, the positional relationship of the semiconductor region 505 as to the isolating portion 506 can be controlled with high accuracy, so noise from the isolating portion can be reduced while reducing effects of variance as to the transfer paths.

Yet another configuration of the photoelectric conversion device according to the present embodiment will be described.

Figure 11A:
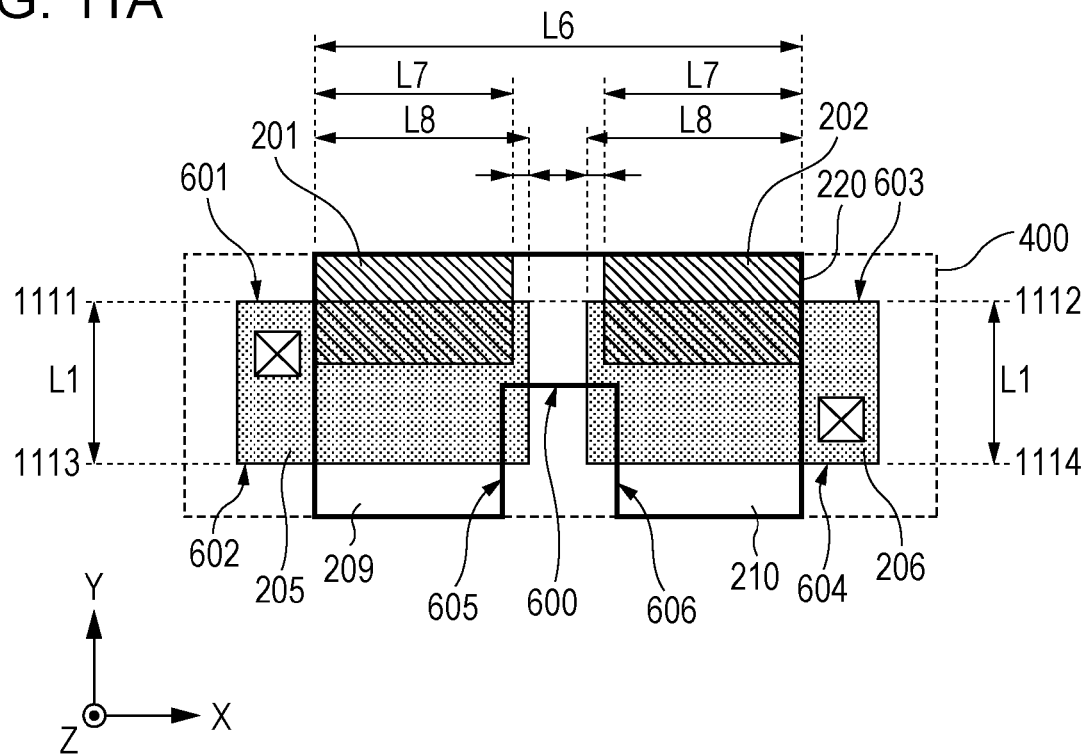
FIG. 11A is a schematic plan view illustrating the photoelectric conversion device according to the first embodiment.
Figure 11B:
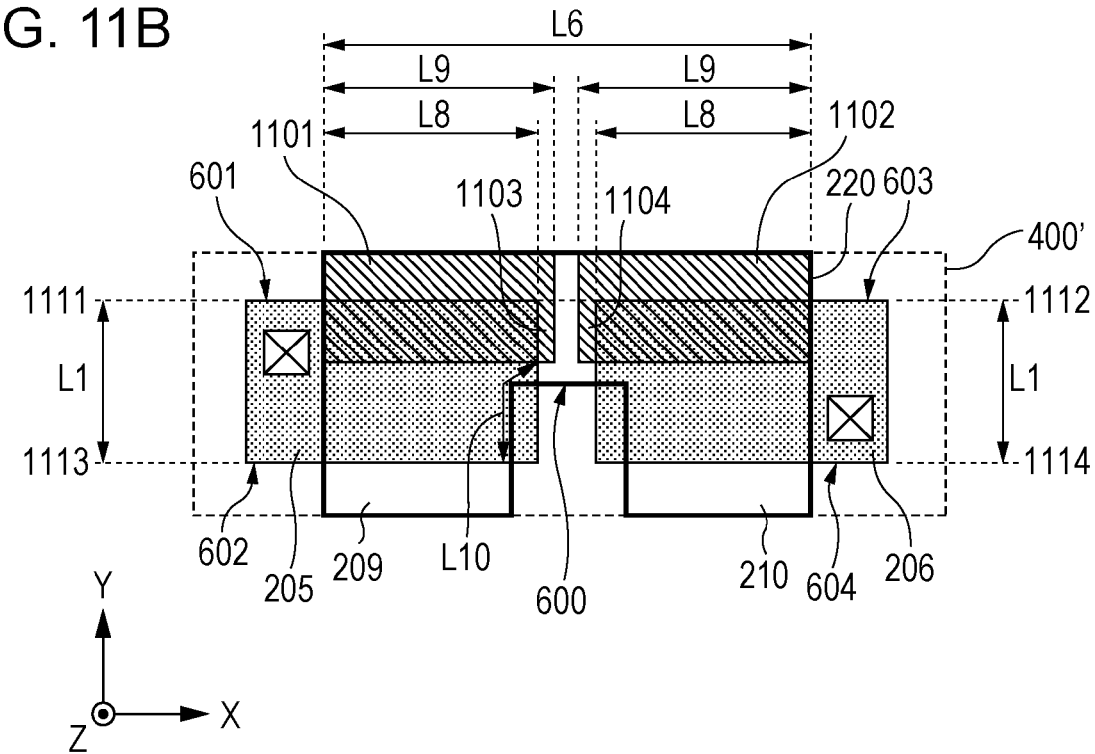
FIG. 11B is a schematic plan view for describing the photoelectric conversion device according to the first embodiment.

The positional relationship between N-type semiconductor regions and gate electrodes in the photoelectric conversion device according to the present embodiment will be described with reference to FIGS. 11A and 11B. FIG. 11A is a schematic plan view illustrating the photoelectric conversion device according to the first embodiment, and is a drawing in which semiconductor regions 251 and 252 have been omitted from FIG. 6A. FIG. 11B is a diagram for comparison. FIG. 11B illustrates semiconductor regions 1101 and 1102 of different widths as compared to the semiconductor regions 201 and 202 constituting the photoelectric conversion element illustrated in FIG. 11A. Other configurations in FIG. 11B are the same as with FIG. 11A. Hereinafter, the term "length" refers to the width in the schematic plan views.

In FIG. 11B, the gate electrode 205 has a side 601 of the semiconductor region 1101. On an imaginary line 1111 including the side 601, the active region 220 has a length L6, the gate electrode 205 has a length L8 at the portion overlapping the active region 220, and the semiconductor region 1101 has a length L9. In other words, at the position where the gate electrode 205 overlaps the active region 220, the length of the side 601 is L8, the length of the active region 220 following the side 601 is L6, and the length of the semiconductor region 1101 following the side 601 is L9. In the same way, the gate electrode 206 has a side 603 at the side of a semiconductor region 1102. On an imaginary line 1112 including the side 603, the active region 220 has a length L6, the semiconductor region 1102 has a length L9, and the gate electrode 206 has a length L8 at the portion overlapping the active region 220. That is to say, at the position where the gate electrode 206 overlaps the active region 220, the length of the side 603 is L8, the length of the active region 220 following the side 603 is L6, and the length of the semiconductor region 1102 following the side 603 is L9. The relation in magnitude of these is length L6>length L9>length L8. Due to this relationship in lengths, the semiconductor region 1101 has a portion 1103 not covered by the gate electrode 205. The semiconductor region 1102 similarly has a portion 1104 not covered by the gate electrode 206. Now, the distance between this portion 1103 and the semiconductor region 209 is length L10, which is shorter than the length L1, which is the gate length of the gate electrode 205. The distance between the portion 1104 and the semiconductor region 210 is the same. This means that the effective transfer path of the transfer transistor includes a short portion, so leakage may occur when turning the transfer transistor off.

On the other hand, the photoelectric conversion device according to the present embodiment has the following configuration, as illustrated in FIG. 11A. The active region 220 has a length L6 along the imaginary line 1111 including the side 601, the semiconductor region 201 has a length L7, and the gate electrode 205 has a length L8. In the same way, the active region 220 has a length L6 along the imaginary line 1112 including the side 602, the semiconductor region 202 has a length L7, and the gate electrode 206 has a length L8. The relation in magnitude of these is length L6>length L8>length L7. The portions of the semiconductor region 201 and semiconductor region 202 not covered by the gate electrode 205 or gate electrode 206 are separated by the length L1 which is the gate length of the gate electrode 205 and gate electrode 206, so leakage can be suppressed. Leakage can be sufficiently suppressed by the portions 1103 and 1104 in FIG. 11B not existing, and length L6>length L8≥length L7 holding true. The effects can be obtained even if this length relationship only holds at one of the gate electrodes. It is sufficient for this relationship to hold at each of two gate electrodes, and the lengths may differ among multiple gate electrodes. However, in order to obtain signals for detection of focus using two photoelectric conversion elements as in the present embodiment, it is particularly preferable that the properties of the two photoelectric conversion elements and transfer transistors are constant, and an equal configuration is preferable. While the imaginary line 1111 and the imaginary line 1112 have been described as being a single straight line, these may be in a positional relationship so as to intersect.

The gate electrode 205 has a side 602 towards the semiconductor region 209, across the gate electrode 205 from the side 601 at the semiconductor region 201, as in FIG. 11A illustrating the photoelectric conversion device according to the present embodiment. In the same way, the gate electrode 206 has a side 604 towards the semiconductor region 210, across the gate electrode 206 from the side 603 at the semiconductor region 202. The imaginary line 1113 including the side 602 and the imaginary line 1114 including the side 604 constitute a single straight line. The side 600 is positioned between the imaginary line 1111 and imaginary line 1113. This configuration enables reduction in leak current and charges from entering, while suppressing increase in the capacity of the FD region.

Now, let us say that the side 600 was provided closer toward the side of the semiconductor region 201 than the imaginary line 1111. The portion where the photoelectric conversion element is to be formed would be smaller, and the saturated charge count of the photoelectric conversion element would be smaller. On the other hand, if the side 600 was provided closer toward the side of the semiconductor region 209 than the imaginary line 1113, the isolation performance between the semiconductor region 209 and semiconductor region 210 would deteriorate, so leak current would readily increase and charges would easily enter. Accordingly, the side 600 is preferably positioned between the imaginary line 1111 and imaginary line 1113, including being positioned upon the imaginary line 1111 or imaginary line 1113.

The isolating portion 506 illustrated in FIG. 6D is configured of a part 653 having a length L5, and a part 654. The thickness of the insulator constituting the part 653 is thinner than the insulator constituting the part 654, so insulating performance deteriorates. Accordingly, the side 600 is preferably positioned away from the semiconductor region 209 by a distance L5 from the imaginary line 1113. While the side 600 may be positioned toward the semiconductor region 201 by a distance L5 from the imaginary line 1111, the side 600 preferably is positioned at the same position as the imaginary line 1111 or below the gate electrode 205 from that position. While description has been made regarding the positional relationship of the side 600 and the imaginary line 1111 and imaginary line 1113, the same holds for the side 600 and the imaginary line 1112 and imaginary line 1114.

Now, one FD region is provided per photoelectric conversion element in the present embodiment. If the area of the FD region increases, the capacity of the FD region increases, and the efficiency of charge-voltage conversion at the FD region decreases. Signal charges subjected to charge-voltage conversion with low efficiency become voltage signals with small amplitude, and will need processing to amplify later at a high amplification factor. Noise is amplified along with signals in the amplification processing, so the image quality may suffer. However, the configuration according to the present embodiment has small FD region capacity, so the amplification processing can be eliminated or the amplification factor made small, thereby reducing noise.

Also, while the present embodiment has been described with multiple FD regions being electrically connected by conductors such as wiring of the like, a configuration may be made where switches are provided between the FD regions. The configuration where one FD region is provided for each photoelectric conversion element, and/or the configuration where multiple FD regions are electrically connected by wiring, as in the present embodiment, enables the capacity of the FD regions to be reduced. If the capacity of FD regions is great, the amplitude of voltage signals obtained by charge-voltage conversion of signal charges from the photoelectric conversion elements at the FD regions is small, and will need processing to amplify later at a high amplification factor. Noise is amplified along with signals in the amplification processing, so the image quality may suffer. However, the configuration according to the present embodiment has small FD region capacity, so the amplification processing can be eliminated or the amplification factor made small, thereby reducing noise.

Second Embodiment

Figure 12:
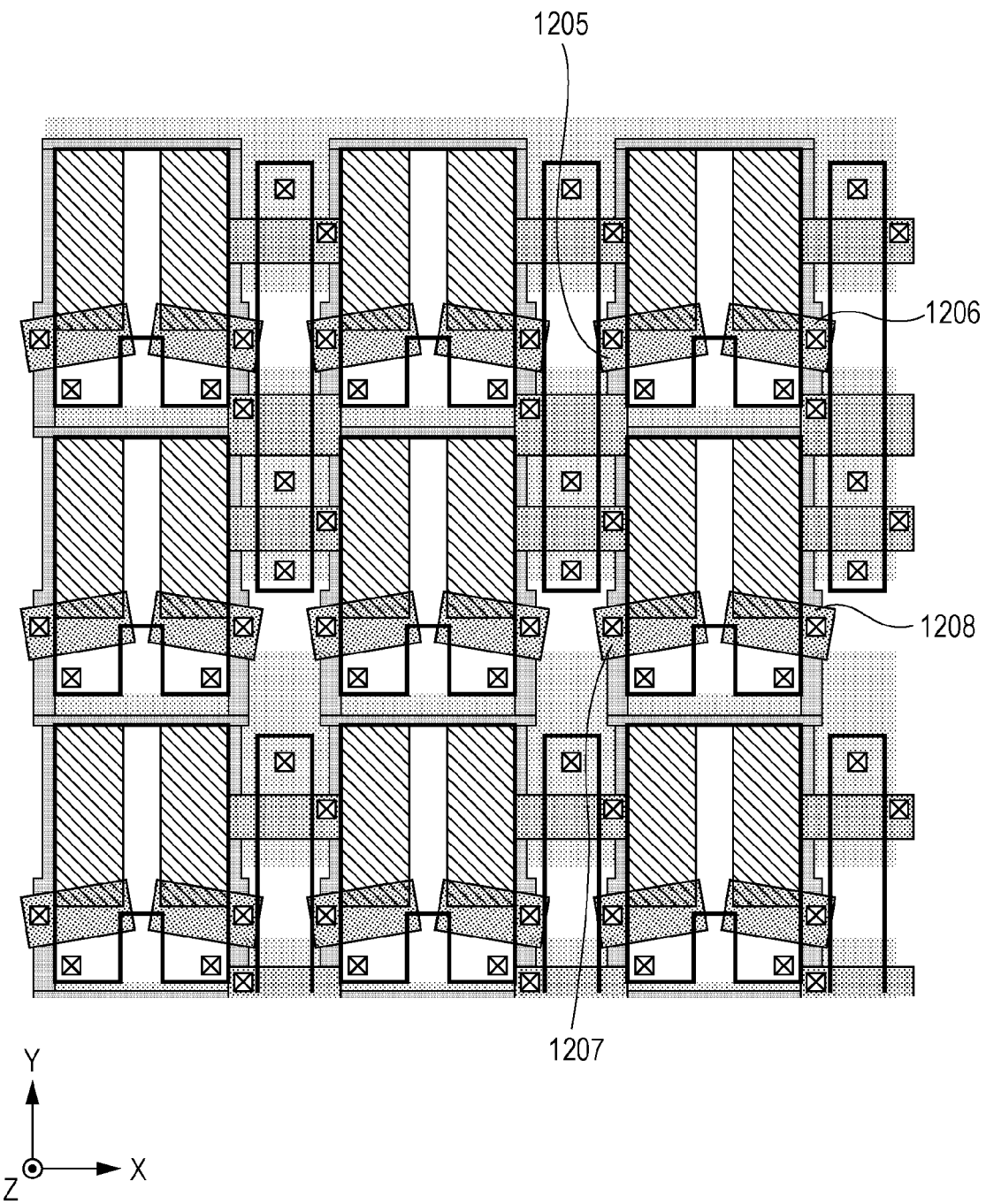
FIG. 12 is a schematic plan view illustrating a photoelectric conversion device according to a second embodiment.

A photoelectric conversion device according to a second embodiment will be described with reference to FIG. 12. FIG. 12 is a schematic plan diagram illustrating a photoelectric conversion device corresponding to FIG. 4. Configurations in FIG. 12 which are the same as those in FIG. 4 are denoted with the same reference numerals, and description thereof will be omitted. The difference as to the first embodiment will be described.

The layout of gate electrodes 1205 through 1208 in FIG. 12 differs from the layout of gate electrodes in FIG. 4. In FIG. 4, the gate electrodes 205 through 208 are disposed in the X-axial direction in parallel, but in FIG. 12 the gate electrodes are disposed inclined as to the X-axial direction. Variance in transistor properties can be reduced with such a gate electrode layout as well, since the P-type impurity concentration at the region 241 is lower than the P-type impurity concentration at the region 240.

Third Embodiment

Figure 13:
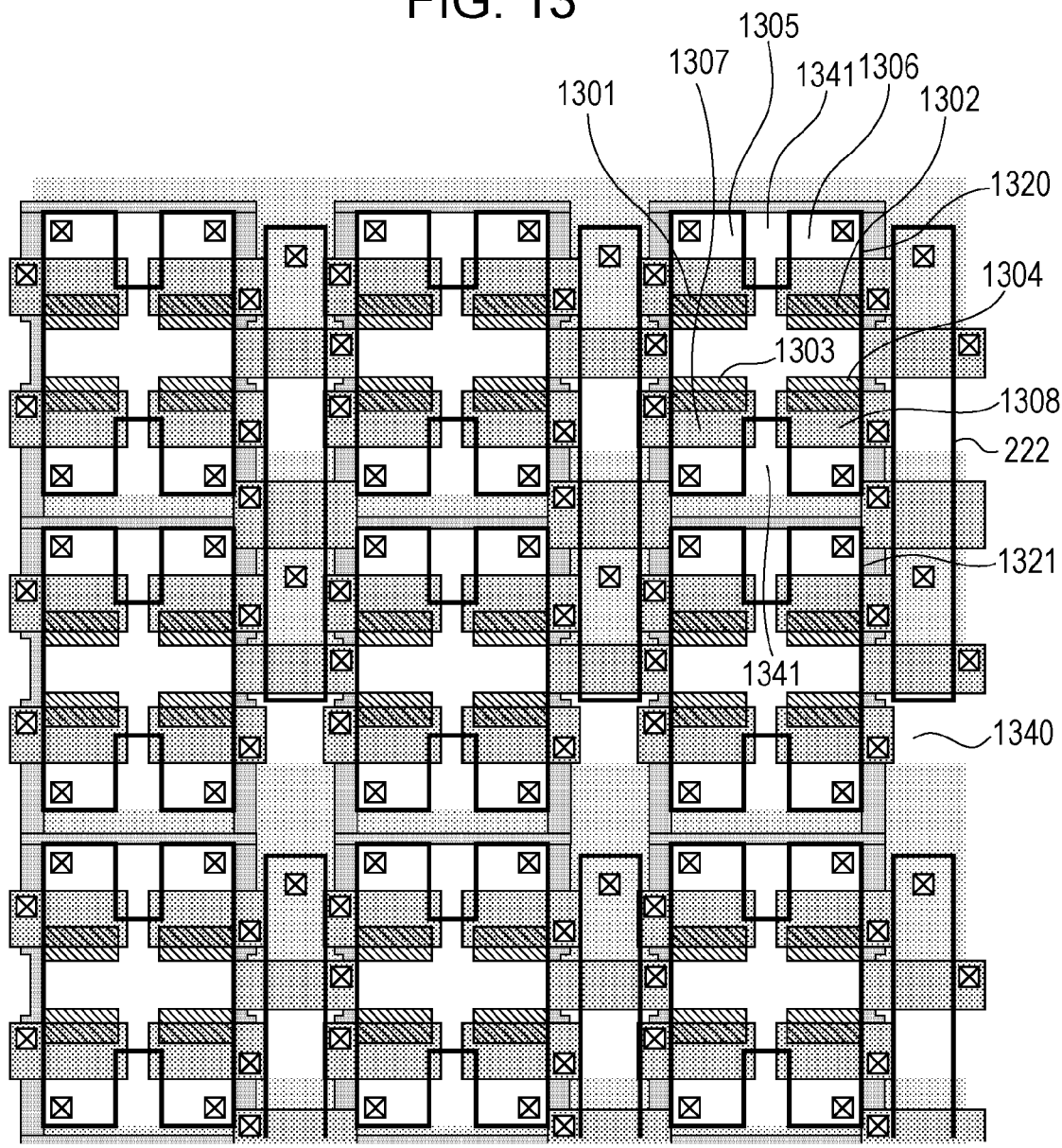
FIG. 13 is a schematic plan view illustrating a photoelectric conversion device according to a third embodiment.

A photoelectric conversion device according to a third embodiment will be described with reference to FIG. 13. FIG. 13 is a schematic plan diagram illustrating a photoelectric conversion device corresponding to FIG. 4. Configurations in FIG. 13 which are the same as those in FIG. 4 are denoted with the same reference numerals, and description thereof will be omitted. The differences as to the photoelectric conversion device according to the first embodiment will be described.

In FIG. 13, the number of photoelectric conversion elements provided to active region 1320 and active region 1321 differs from that in FIG. 4. While two photoelectric conversion elements are provided to one active region in FIG. 4, four photoelectric conversion elements are provided to one active region in FIG. 13. N-type semiconductor regions 1301 through 1304 are provided to the active region 1320. Accordingly, more gate electrodes are provided in FIG. 13 as compared to FIG. 4, with gate electrodes 1305 through 1308 being provided. The transfer direction of signal charges by the gate electrodes is divided into two directions following the Y-axial direction. A region 1341 is provided between the gate electrode 1305 and gate electrode 1306, and a region 1341 is also provided between the gate electrode 1307 and gate electrode 1308. Variance in transistor properties can be reduced with such a layout as well, since the P-type impurity concentration at the region 1341 is lower than the P-type impurity concentration at the region 1340.

Fourth Embodiment

Figure 14A:
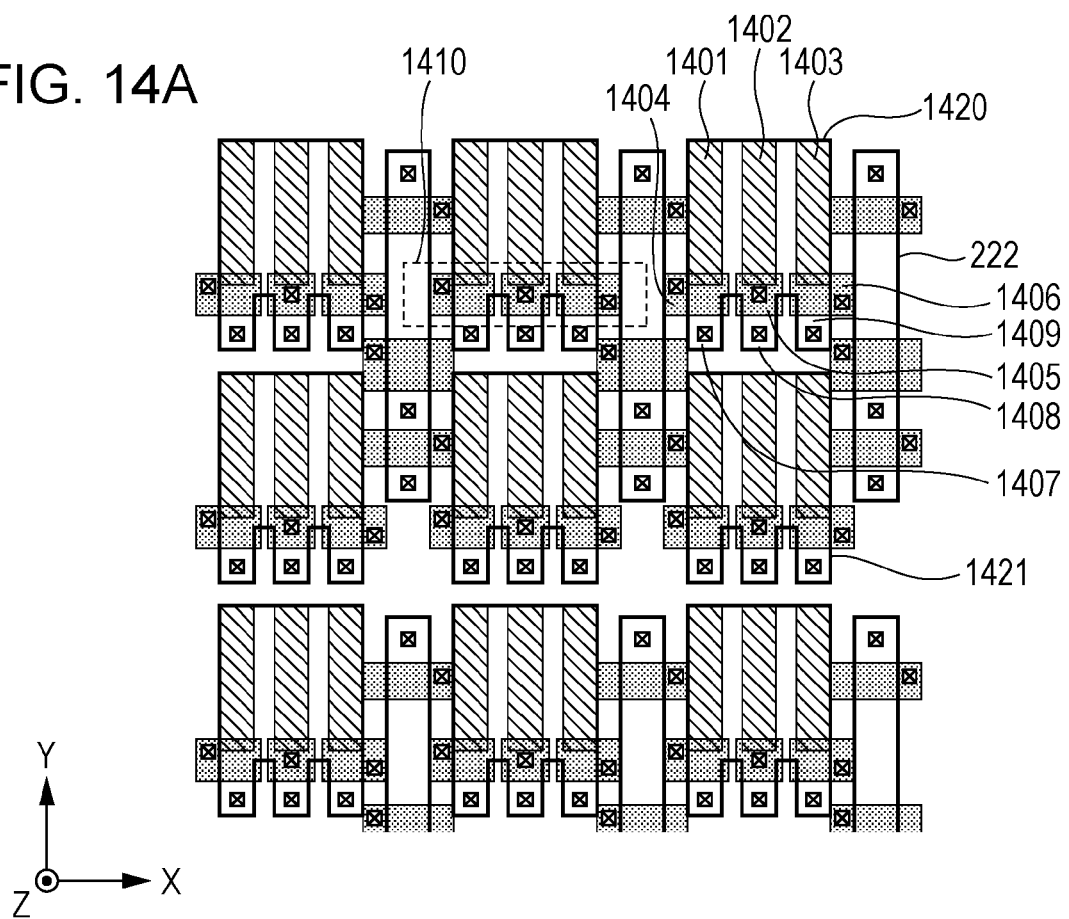
FIGS. 14A and 14B are schematic plan views illustrating a photoelectric conversion device according to a fourth embodiment.
Figure 14B:
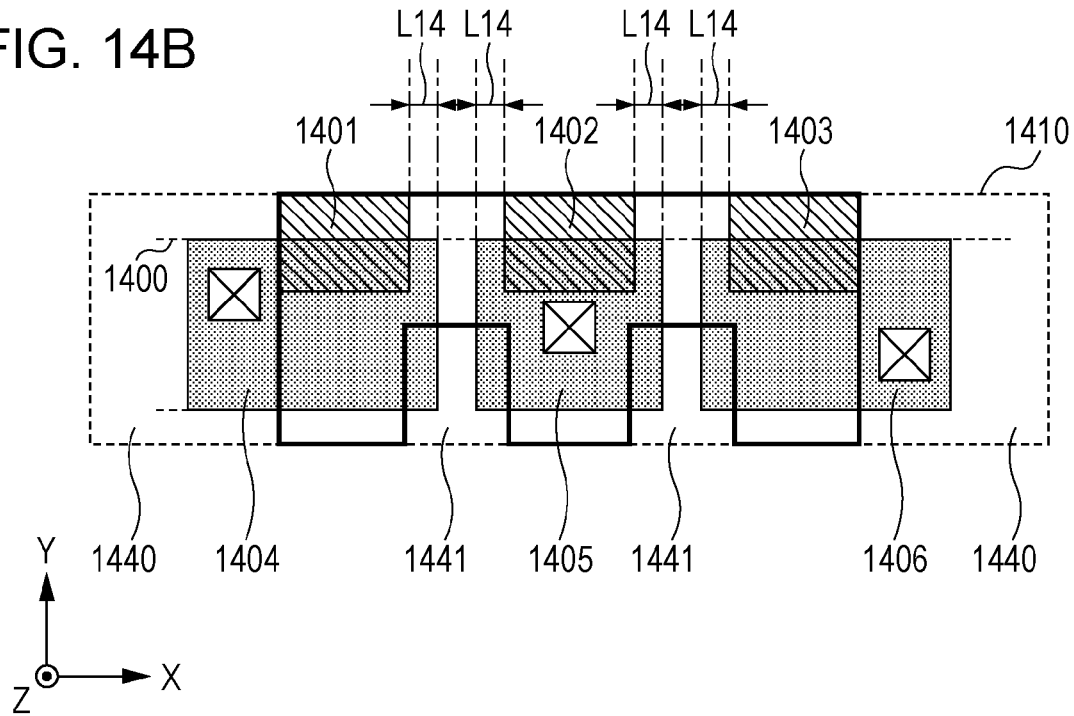

A photoelectric conversion device according to a fourth embodiment will be described with reference to FIGS. 14A and 14B. FIG. 14A is a schematic plan diagram illustrating a photoelectric conversion device corresponding to FIG. 4. FIG. 14B is an enlarged view of region 1410 in FIG. 14A. The difference between the photoelectric conversion device according to the present embodiment and the photoelectric conversion device according to the first embodiment will be described.

As can be seen from FIG. 14A, the number of photoelectric conversion elements provided to the active region 1420 and active region 1421 differ from that in FIG. 4. While two N-type semiconductor regions are provided to one active region in FIG. 4, three N-type semiconductor regions, i.e., three photoelectric conversion elements, are provided to one active region in the present embodiment. Semiconductor regions 1401 through 1403 are provided to the active region 1420, and gate electrodes 1404 through 1406 and semiconductor regions 1407 through 1409 to become FD regions are also provided. In such a configuration as well, the gate electrode 1404 is longer than the semiconductor region 1401 by a length L14 at the imaginary line 1400 as illustrated in FIG. 14B. This holds the same for the relationship between the gate electrodes 1405 and 1406, and semiconductor regions 1402 and 1403 as well. Variance in transistor properties can be reduced with such a layout as well, since the P-type impurity concentration at the region 1441 is lower than the P-type impurity concentration at the region 1440.

Fifth Embodiment

Figure 15A:
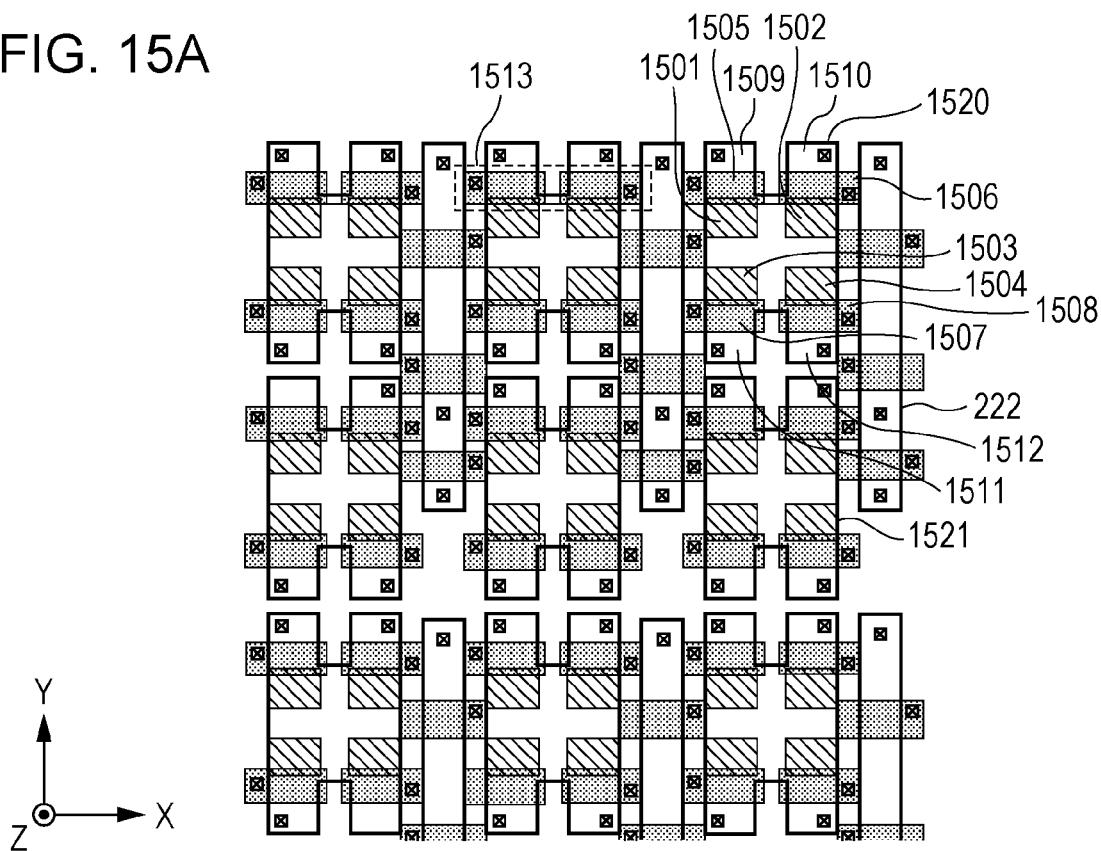
FIGS. 15A and 15B are schematic plan views illustrating a photoelectric conversion device according to a fifth embodiment.
Figure 15B:
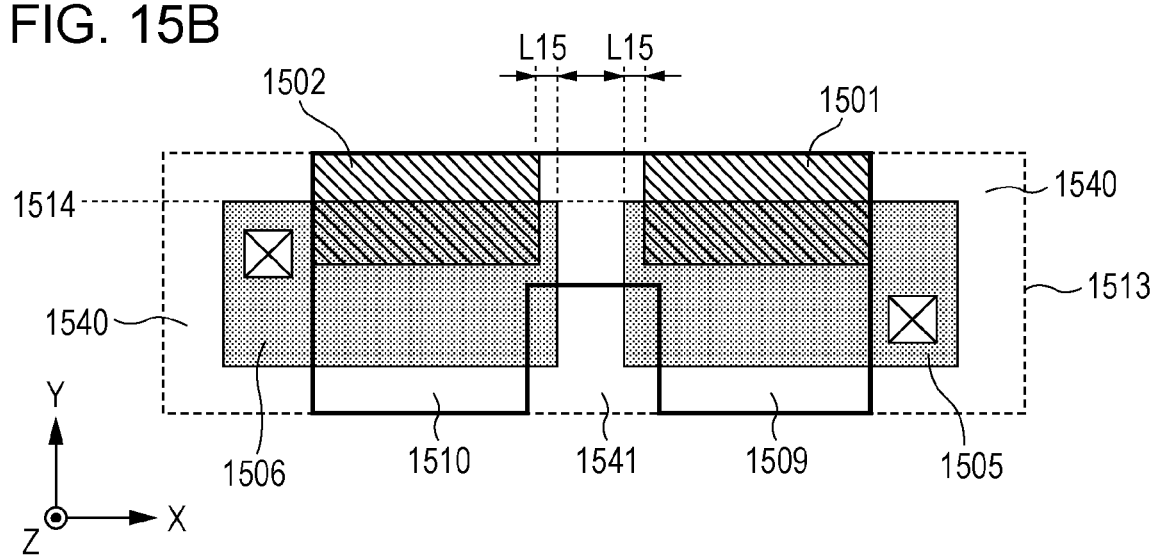

A photoelectric conversion device according to a fifth embodiment will be described with reference to FIGS. 15A and 15B. FIG. 15A is a schematic plan diagram illustrating a photoelectric conversion device corresponding to FIG. 4. FIG. 15B is an enlarged view of a region 1513 in FIG. 15A. The differences in FIGS. 15A and 15B as to the photoelectric conversion device according to the first embodiment will be described.

As can be seen from FIG. 15A, the number of photoelectric conversion elements provided to the active region 1520 and active region 1521 differ from that in FIG. 4. While two N-type semiconductor regions are provided to one active region in FIG. 4, four N-type semiconductor regions are provided to one active region in the present embodiment. Semiconductor regions 1501 through 1504 are provided to the active region 1520, and gate electrodes 1505 through 1508. The transfer direction of signal charges by the gate electrodes is divided into two directions following the Y-axial direction. In such a configuration as well, the gate electrode 1506 is longer than the semiconductor region 1502 by a length L15 on an imaginary line 1514, as illustrated in FIG.

15B. This holds the same for the relationship between the gate electrode 1505 and semiconductor region 1501 as well, and also the same for the relationship between the semiconductor regions 1503 and 1504, and gate electrodes 1507 and 1508, where the transfer direction is opposite. Variance in transistor properties can be reduced with such a layout as well, since the P-type impurity concentration at the region 1541 is lower than the P-type impurity concentration at the region 1540.

Sixth Embodiment

A photoelectric conversion device according to a sixth embodiment will be described with reference to FIGS. 16A and 16B. The photoelectric conversion device according to the present embodiment differs from the photoelectric conversion device according to the first embodiment in that a switch connecting FD nodes has been provided. Configurations in FIGS. 16A and 16B which are the same as those in the first embodiment are denoted with the same reference numerals, and description thereof will be omitted.

Figure 16A:
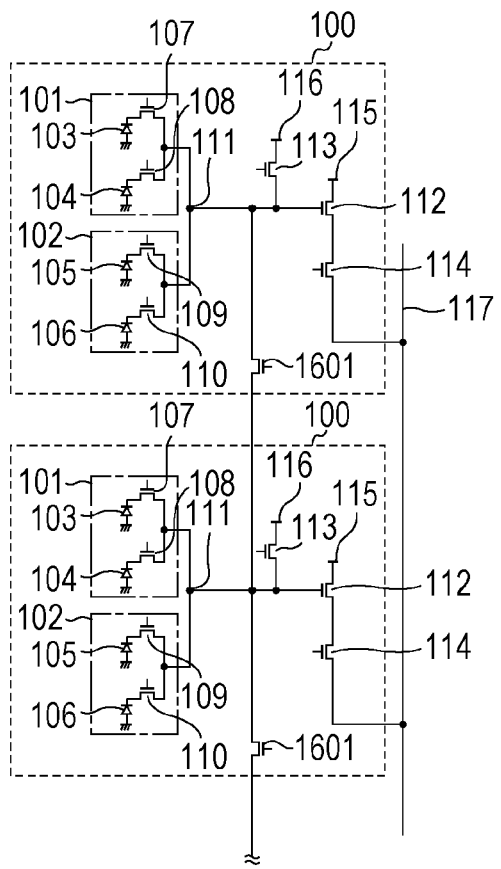
FIG. 16A is an equivalent circuit diagram of a photoelectric conversion device according to a sixth embodiment.

FIG. 16A is an equivalent circuit diagram of a photoelectric conversion device according to the present embodiment. As can be seen in FIG. 16A, a transistor 1601 connecting FD nodes 111 of adjacent pixel cells 100 is provided between the adjacent pixel cells 100. This configuration allows the signal charges of pixels in different pixel cells to be added at the FD nodes.

Figure 16B:
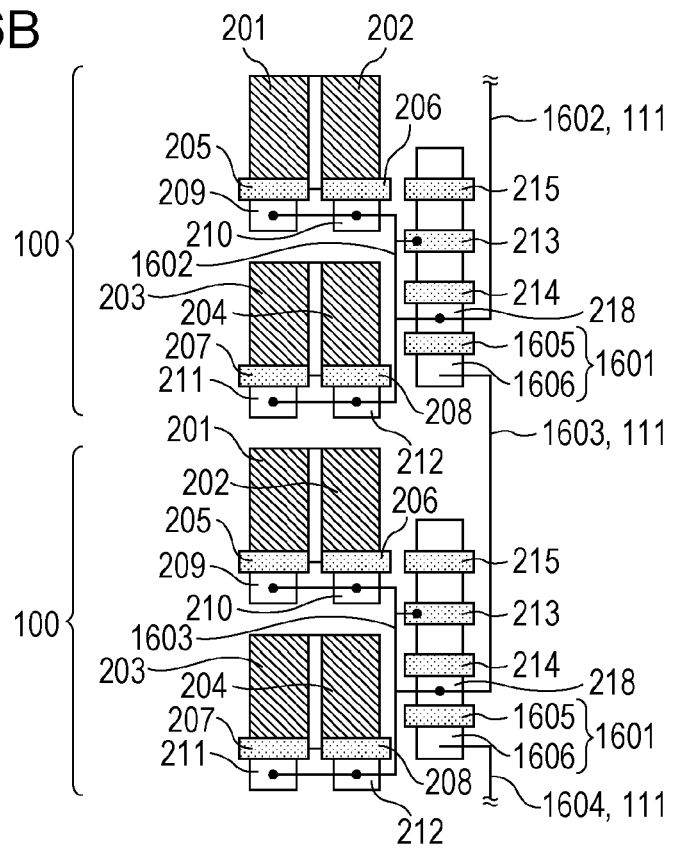
FIG. 16B is a schematic plan view illustrating the photoelectric conversion device according to the sixth embodiment.

FIG. 16B is a schematic plan view illustrating two pixel cells 100 illustrated in FIG. 16A. Lines 1602 through 1604 schematically represent conductors such as contact plugs and wiring and the like, and represent electrical connection. Each transistor 1601 has a gate electrode 1605 and semiconductor region 1606. The transistors 1601 share a reset transistor and semiconductor region 218. The semiconductor region 1606 in FIG. 16B is connected to the semiconductor region 218 of another pixel cell 100 by the line 1603. That is to say, the semiconductor region 1606 and semiconductor region 218 are electrically connected. The semiconductor regions 209 through 212 to become FD regions are provided separately from the semiconductor regions 209 through 212 of the adjacent pixel cell 100, via the transistor 1601. This configuration allows the semiconductor regions to serve as FD regions separately, while enabling addition of signal charges with another pixel cell 100, so increase in the capacity of the FD regions can be suppressed.

Imaging System

The photoelectric conversion device according to the first through sixth embodiments is included in imaging systems, such as cameras and the like. The concept of imaging systems is not restricted to devices of which the primary purpose is to perform imaging, and also includes devices having supplemental imaging functions (e.g., personal computers and cellular phones). An imaging system may include the photoelectric conversion device according to the embodiments described exemplarily, and a signal processing unit to process signals output from the photoelectric conversion device. This signal processing unit may include, for example, an A/D converter, and a processor to process digital data output from the A/D converter. Focus detection signals may be detected by the photoelectric conversion device according to the first through fifth embodiments, or a separate device may be provided to perform detection thereof. Focal point detection processing may be performed by the processing unit, or a focal point detection processing unit to perform focal point detection processing may be provided separately, and may be modified as appropriate.

The photoelectric conversion device and the manufacturing method thereof according to the present invention are not restricted to the first through sixth embodiments, and may be modified as appropriate. These embodiments may also be combined as appropriate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-137049 filed Jun. 28, 2013, which is hereby incorporated by reference herein in its entirety.

What is claimed is:

1. A photoelectric conversion device manufacturing method, comprising:
    forming in a second portion of a semiconductor substrate, an isolating portion formed of an insulator, including a first region and a second region, and defining an active region in a first portion of the semiconductor substrate;
    forming,
        a first semiconductor region of a first conductivity type, which is positioned in the active region, and constitutes a first photoelectric conversion element,
        a second semiconductor region of the first conductivity type, which is positioned in the active region, and constitutes a second photoelectric conversion element,
        a third semiconductor region of the first conductivity type, which is positioned in the active region,
        a fourth semiconductor region of the first conductivity type, which is positioned in the active region,
        a first gate electrode, on a region between the first semiconductor region and the third semiconductor region, the first gate electrode extending so as to overlap the first region, and the first gate electrode configuring a first transfer transistor conjointly with the first semiconductor region and the third semiconductor region, and
        a second gate electrode, on a region between the second semiconductor region and the fourth semiconductor region, the second gate electrode extending so as to overlap the first region, and the second gate electrode configuring a second transfer transistor conjointly with the second semiconductor region and the fourth semiconductor region; and
    forming a fifth semiconductor region at least beneath the second region of the isolating portion by performing ion implantation using a first photoresist pattern covering the first region of the semiconductor substrate as a mask.

2. The photoelectric conversion device manufacturing method according to claim 1,
    wherein the first region is positioned between the third semiconductor region and the fourth semiconductor region.

3. The photoelectric conversion device manufacturing method according to claim 1, further comprising:
    forming a second photoresist pattern exposing the second portion where the isolating portion is to be formed;
    forming the isolating portion by performing thermal treatment; and
    forming a sixth semiconductor region of the second conductivity type by performing ion implantation using the second photoresist pattern as a mask.

4. The photoelectric conversion device manufacturing method according to claim 3,
wherein the semiconductor substrate is formed of silicon, and
wherein the forming of the isolating portion includes forming a silicon oxide film by the thermal processing.

5. The photoelectric conversion device manufacturing method according to claim 3,
wherein the forming of the isolating portion is performed after the forming of the sixth semiconductor region.

6. The photoelectric conversion device manufacturing method according to claim 1, further comprising:
forming a third photoresist pattern exposing the second region of the semiconductor substrate and covering the first region of the semiconductor substrate; and
forming a seventh semiconductor region of the second conductivity type, by performing ion implantation with the third photoresist pattern as a mask.

7. The photoelectric conversion device manufacturing method according to claim 6,
wherein the amount of acceleration energy for ion implantation in the forming of the seventh semiconductor region is greater than the amount of acceleration energy for ion implantation in the forming of the fifth semiconductor region.

8. The photoelectric conversion device manufacturing method according to claim 1,
wherein the forming the first semiconductor region and the second semiconductor region are performed after the forming of the first gate electrode and the second gate electrode.

9. The photoelectric conversion device manufacturing method according to claim 8,
wherein the forming of the first semiconductor region and the second semiconductor region includes
forming a fourth photoresist pattern including a first opening exposing a portion where the first semiconductor region is to be formed, a second opening exposing a portion where the second semiconductor region is to be formed, and a wall portion provided between the first opening and the second opening, and
perform ion implantation with the fourth photoresist pattern as a mask.

10. The photoelectric conversion device manufacturing method according to claim 9, further comprising:
forming an eighth semiconductor region of the second conductivity type on the first semiconductor region; and
forming a ninth semiconductor region of the second conductivity type on the second semiconductor region;
wherein the forming of the eighth and ninth semiconductor regions are performed after the forming of the first and second gate electrodes and first and second semiconductor regions;
and wherein the forming of the eight semiconductor region and the forming of the ninth semiconductor region include
forming a fifth photoresist pattern having an opening exposing a portion where the first semiconductor region and the second semiconductor region have been formed, and an opening where between the first gate electrode and the second gate electrode is exposed, and
performing ion implantation with the fifth photoresist pattern as a mask.

11. The photoelectric conversion device manufacturing method according to claim 1, further comprising:
forming one microlens for a set of the first semiconductor region and the second semiconductor region.

12. A photoelectric conversion device formed by the photoelectric conversion device manufacturing method according to claim 1.

13. A photoelectric conversion device, comprising:
a semiconductor substrate upon which is provided
an active region, and
an isolating portion formed of an insulator which defines the active region, and includes
a first region and
a second region which is other than the first region;
a first semiconductor region of a first conductivity type, which is positioned in the active region, and constitutes a first photoelectric conversion element;
a second semiconductor region of the first conductivity type, which is positioned in the active region, and constitutes a second photoelectric conversion element;
a third semiconductor region of the first conductivity type, which is positioned in the active region;
a fourth semiconductor region of the first conductivity type, which is positioned in the active region;
a first gate electrode, positioned on a region between the first semiconductor region and the third semiconductor region in the active region, and extending over the first region, and configuring a first transfer transistor conjointly with the first semiconductor region and the third semiconductor region; and
a second gate electrode, positioned on a region between the second semiconductor region and the fourth semiconductor region in the active region, and extending over the first region, and configuring a second transfer transistor conjointly with the second semiconductor region and the fourth semiconductor region;
wherein an impurity concentration of the second conductivity type of the semiconductor substrate in the first region is lower than the impurity concentration of the second conductivity type of the semiconductor substrate in the second region.

14. The photoelectric conversion device according to claim 13, further comprising:
a fifth semiconductor region of the second conductivity type, under the isolating portion;
wherein the fifth semiconductor region is provided in the second region, and is not provided in the first region.

15. An imaging system, comprising:
the photoelectric conversion device according to claim 12; and
a signal processing unit configured to process signals from the photoelectric conversion device.

16. An imaging system, comprising:
the photoelectric conversion device according to claim 13; and
a signal processing unit configured to process signals from the photoelectric conversion device.

* * * * *